United States Patent
Shin et al.

(10) Patent No.: US 9,610,847 B2
(45) Date of Patent: Apr. 4, 2017

(54) POWER CONVERSION DEVICE

(75) Inventors: Kentaro Shin, Yokohama (JP); Kraisorn Throngnumchai, Yokohama (JP)

(73) Assignee: Nissan Motor Co., Ltd., Yokohama-Shi, Kanagawa (JP)

( * ) Notice: Subject to any disclaimer, the term of this patent is extended or adjusted under 35 U.S.C. 154(b) by 483 days.

(21) Appl. No.: 14/238,226

(22) PCT Filed: Jul. 18, 2012

(86) PCT No.: PCT/JP2012/068208
§ 371 (c)(1),
(2), (4) Date: Feb. 11, 2014

(87) PCT Pub. No.: WO2013/031405
PCT Pub. Date: Mar. 7, 2013

(65) Prior Publication Data
US 2014/0192577 A1   Jul. 10, 2014

(30) Foreign Application Priority Data
Aug. 30, 2011  (JP) ................ 2011-186995

(51) Int. Cl.
*H02M 1/14* (2006.01)
*B60L 11/18* (2006.01)
(Continued)

(52) U.S. Cl.
CPC ......... *B60L 11/1803* (2013.01); *H02M 7/003* (2013.01); *H05K 7/1432* (2013.01); *H02M 1/14* (2013.01)

(58) Field of Classification Search
CPC ..... B60L 11/1803; H02M 7/003; H02M 1/14; H05K 7/1432
(Continued)

(56) References Cited

U.S. PATENT DOCUMENTS 4,412,255 A * 10/1983 Kuhlman ................. H05K 9/00
174/389
6,459,597 B1  10/2002 Igarashi et al.
(Continued)

FOREIGN PATENT DOCUMENTS

CN        85106529 A     3/1987
CN       102160127 A     8/2011
(Continued)

OTHER PUBLICATIONS

English translation of JP 2009-027089, Feb. 5, 2009.*

*Primary Examiner* — Hal Kaplan
(74) *Attorney, Agent, or Firm* — Young Basile Hanlon & MacFarlane, P.C.

(57) ABSTRACT

In the present invention, a power conversion device is provided with an inverter for converting power output from a power source; a first power supply bus, connected to the positive electrode side of the inverter and the power source; a second power supply bus, connected to the negative electrode sides of the inverter and the power source; a first conductor that forms, along with the first power supply bus, a capacitor; a second conductor that forms, along with the second power supply bus, a capacitor; and a connection circuit, comprising a resistor, that electrically connects the first conductor and the second conductor.

16 Claims, 22 Drawing Sheets

(51) Int. Cl.
*H02M 7/00* (2006.01)
*H05K 7/14* (2006.01)

(58) Field of Classification Search
USPC .......................................................... 307/151
See application file for complete search history.

(56) References Cited

U.S. PATENT DOCUMENTS

| | | | |
|---|---|---|---|
| 7,446,257 B2 | 11/2008 | Witthoft | |
| 7,902,456 B2 * | 3/2011 | Witthoft ............. | H01B 11/1839 |
| | | | 174/102 R |
| 8,304,654 B2 * | 11/2012 | Abe ................... | H01B 11/1817 |
| | | | 174/102 R |
| 2007/0205008 A1 | 9/2007 | Witthoft | |
| 2009/0020310 A1 | 1/2009 | Witthoft et al. | |
| 2011/0131802 A1 | 6/2011 | Witthoft et al. | |
| 2012/0094553 A1 | 4/2012 | Fujiwara et al. | |

FOREIGN PATENT DOCUMENTS

| | | |
|---|---|---|
| JP | 2001186776 A | 7/2001 |
| JP | 2001359230 A | 12/2001 |
| JP | 2002252985 A | 9/2002 |
| JP | 2003319665 A | 11/2003 |
| JP | 2004048823 A | 2/2004 |
| JP | 2006031959 A | 2/2006 |
| JP | 2006196678 A | 7/2006 |
| JP | 2007209141 A | 8/2007 |
| JP | 2008301684 A | 12/2008 |
| JP | 2009-027089 A | 2/2009 |
| WO | 2010143584 A1 | 12/2010 |

* cited by examiner

FIG. 2
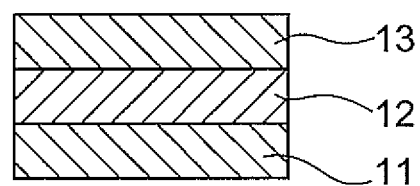
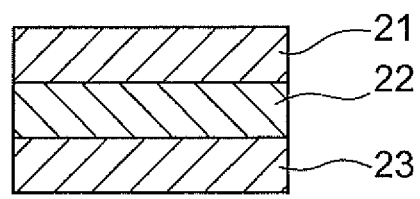

POWER CONVERSION DEVICE

CROSS REFERENCE TO RELATED APPLICATION

The present application claims priority to Japanese Patent Application No. 2011-186995, filed Aug. 30, 2011, incorporated herein in its entirety.

TECHNICAL FIELD

The present invention relates to a power conversion device.

BACKGROUND ART

There has been known a noise reduction device for reducing noise generated in a power conversion device that includes: a converter connected to an AC power supply; an inverter connected to a DC output side of the converter; and a DC smoothing capacitor connected to a DC intermediate circuit (see Japanese Patent Application Publication No. 2002-252985). The noise reduction device is a device configured to reduce a noise current which flows on the power conversion device in response to the turning on and off of semiconductor switching elements that constitute the inverter. The noise reduction device includes: a noise current detection unit configured to detect the noise current; and a noise compensation current supply unit configured to generate a noise compensation current for reducing the detected noise current, and to supply the noise compensation current to the power conversion device. The noise compensation current supply unit is an element whose output current is controlled according to a detection signal from the noise current detection unit. The noise compensation current supply unit includes a series circuit including transistors each having a breakdown voltage smaller than a voltage of the DC intermediate circuit; and Zener diodes.

However, there is a problem that the transistors and the Zener diodes cannot perform high-speed operations against high-frequency switching noise, thereby failing to suppress the noise.

BRIEF SUMMARY

An object of the present invention is to provide a power conversion device which is capable of suppressing noise caused by the switching of an inverter.

A power conversion device according to an aspect of the present invention includes: a first power supply bus being a power supply bus on a positive electrode side and a second power supply bus being a power supply bus on a negative electrode side, the power supply buses being connected to an inverter; a first conductive body and a second conductive body forming capacitors in conjunction with the first power supply bus and the second power supply bus, respectively; and a connection circuit provided with a resistor and configured to electrically connect the first conductive body and the second conductive body together.

BRIEF DESCRIPTION OF DRAWINGS

The description herein makes reference to the accompanying drawings wherein like reference numerals refer to like parts throughout the several views, and wherein:

FIG. 2 is a cross-sectional diagram of the drive system taken along the II-II line of FIG. 1.

DESCRIPTION OF EMBODIMENTS

Embodiments of the present invention will be described below on the basis of the drawings.

First Embodiment

Figure 1:
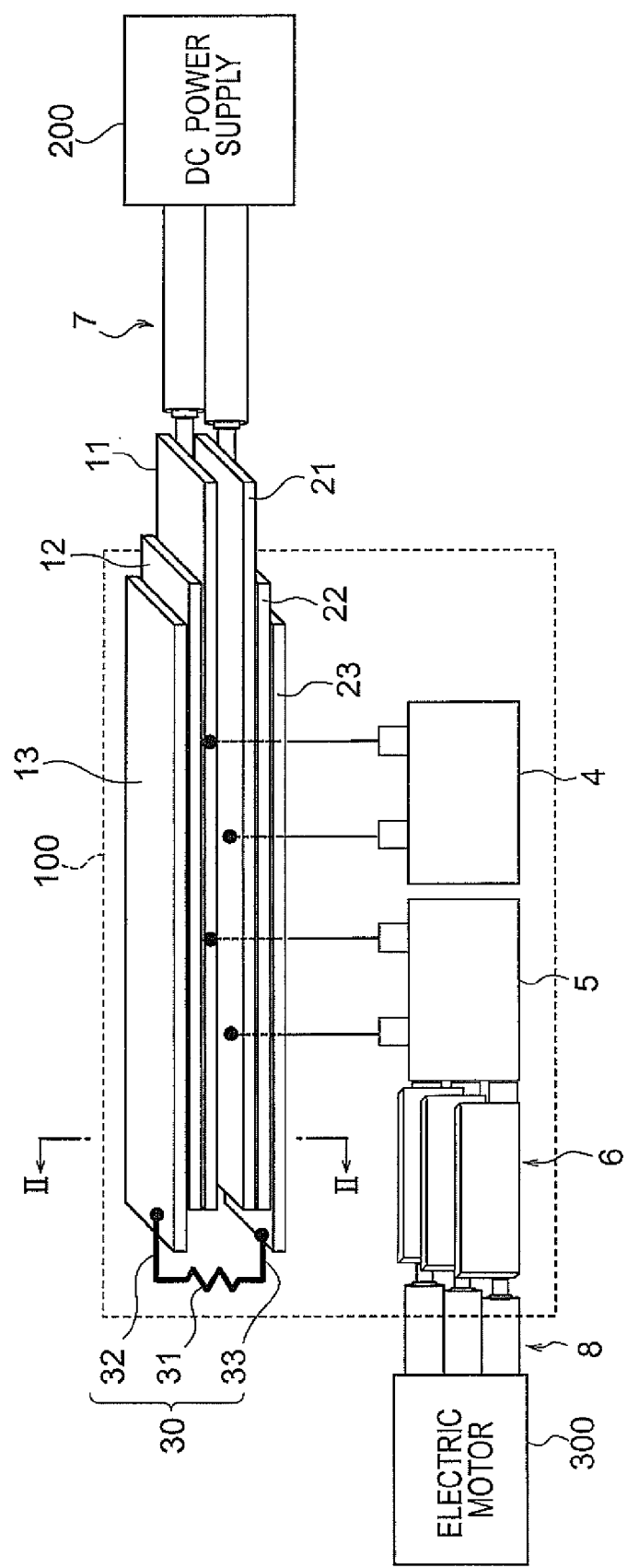
FIG. 1 is a schematic diagram of a drive system for an electric vehicle including a power conversion device according to an embodiment of the present invention.

A drive system for an electric vehicle including a power conversion device according to an embodiment of the present invention will be described with reference to FIG. 1 and FIG. 2. Although detailed illustration is omitted therein, an electric vehicle of this embodiment is a vehicle which runs on an electric motor 300, such as a three-phase AC electric motor, as a running drive source. The electric motor 300 is joined to an axle of the electric vehicle. Although the following description will be provided by using the electric vehicle as an example, the present invention is also applicable to a hybrid electric vehicle (HEV), and to a power conversion device to be installed in equipment other than vehicles.

The drive system having the power conversion device of this embodiment includes a power conversion device 100, a DC power supply 200, the electric motor 300, and shielded wires 7 and 8. The DC power supply 200 is formed from multiple batteries and is connected to the power conversion device 100 through the shielded wires 7. The DC power supply 200 serves as a power source for the vehicle and supplies DC power to the power conversion device 100. The power conversion device 100 is connected between the DC power supply 200 and the electric motor 300, and is configured to change the DC power supplied from the DC power supply 200 into AC power and to supply the AC power to the electric motor 300. The shielded wires 7 and 8 are electric wires formed by covering metal wires with a resin. The shielded wires 7 include a pair of shielded wires. One of the shielded wires 7 connects a positive electrode terminal of the DC power supply 200 to a power supply bus 11, and the other shielded wire 7 connects a negative electrode terminal of the DC power supply 200 to a power supply bus 21. The shielded wires 8 include three shielded wires. The three shielded wires 8 correspond to U phase, V phase, and W phase of the electric motor 300, and connect bus bars 6 to the electric motor 300.

The power conversion device 100 includes the power supply buses 11 and 21, dielectric bodies 12 and 22, conductive bodies 13 and 23, a connection circuit 30, a smoothing capacitor 4, a power module 5, and the bus bars 6. The power supply bus 11 is a power supply line formed from a conductive body in a plate shape such as a flat plate shape, and configured to supply electric power outputted from the positive electrode of the DC power supply 200 to the power module 5. The power supply bus 11 corresponds to a P-side power supply line of an inverter circuit that constitutes the power conversion device 100. The power supply bus 21 is a power supply line formed from a conductive body in a plate shape such as a flat plate shape, and is configured to supply electric power outputted from the negative electrode side of the DC power supply 200 to the power module 5. The power supply bus 21 corresponds to an N-side power supply line of the inverter circuit that constitutes the power conversion device 100. Of the two side surfaces of the power supply bus 11, an inner side surface of the power supply bus 11, which does not face the dielectric body 12, is opposed to an inner side surface of the power supply bus 21. Similarly, of the two side surfaces of the power supply bus 21, the inner side surface of the power supply bus 21, which does not face the dielectric body 22, is opposed to the inner side surface of the power supply bus 11. Parts of the power supply buses 11 and 21, or tip end portions of the power supply buses 11 and 21, serve as terminals (tabs) of the power conversion device 100 and are connected to tip ends of the shielded wires 7.

The dielectric body 12 is formed in a plate shape such as a flat plate shape, and is made from a material such as a resin having a higher dielectric constant than the power supply bus 11 and the conductive body 13. The two side surfaces of the dielectric body 12 are opposed to a principal surface of the power supply bus 11 and a principal surface of the conductive body 13, respectively. The dielectric body 12 is provided between the power supply bus 11 and the conductive body 13, and is sandwiched between the power supply bus 11 and the conductive body 13. The dielectric body 22 is formed in a plate shape such as a flat plate shape, and is made from a material having a higher dielectric constant than the power supply bus 21 and the conductive body 23. The two side surfaces of the dielectric body 22 are opposed to a principal surface of the power supply bus 21 and a principal surface of the conductive body 23, respectively. The dielectric body 22 is provided between the power supply bus 21 and the conductive body 23, and is sandwiched between the power supply bus 21 and the conductive body 23.

The conductive body 13 is made from a conductive material in a plate shape, and is attached to the surface of the dielectric body 12 by attaching a metal tape to the dielectric body 12, for example. The inner side surface of the conductive body 13 is located at a position opposed to the outer side surface of the dielectric body 12. The conductive body 23 is made from a conductive material in a plate shape, and is attached to the surface of the dielectric body 22 by attaching a metal tape to the dielectric body 22, for example. The inner side surface of the conductive body 23 is located at a position opposed to the outer side surface of the dielectric body 22.

The power supply bus 11, the dielectric body 12, and the conductive body 13 include the dielectric material (an insulating material) and the two conductive plates sandwiched together with the dielectric material (the insulating material), thereby collectively forming a capacitor that accumulates electric charges. Similarly, the power supply bus 21, the dielectric body 22, and the conductive body 23 include the dielectric material (the insulating material) and the two conductive plates sandwiched together with the dielectric material (the insulating material), thereby collectively forming a capacitor that accumulates electric charges. In other words, a space between the power supply bus 11 and the conductive body 13 is insulated and provided with capacitance, while a space between the power supply bus 21 and the conductive body 23 is insulated and provided with capacitance.

The connection circuit 30 includes a resistor 31, and lines 32 and 33. The connection circuit 30 is a circuit configured to electrically connect the conductive body 13 and the conductive body 23 together. The resistor 31 is provided therein in order to impart a resistance component to the connection circuit 30. A resistance value of the resistor 31 is set at least higher than resistance values of the conductive bodies 13 and 23, and is made higher than resistance values of the line 32 and the line 33. One end of the line 32 is connected to the conductive body 13 while the other end thereof is connected to the resistor 31. One end of the line 33 is connected to the conductive body 23 while the other end thereof is connected to the resistor 31. In other words, the connection circuit 30 includes the resistor 31 so as to establish electrical communication between the conductive body 13 and the conductive body 23 while preventing the occurrence of a short circuit between the conductive body 13 and the conductive body 23.

Parts of the power supply buses 11 and 21 branch off, and the parts branching from the power supply bus 11 are connected to a positive terminal of the smoothing capacitor 4 and a positive terminal of the power module 5, respectively, while the parts branching from the power supply bus 21 are connected to a negative terminal of the smoothing capacitor 4 and a negative terminal of the power module 5, respectively. The smoothing capacitor 4 is connected between the power supply bus 11 and the power supply bus 21, and is thereby connected between the DC power supply 200 and the power module 5. The smoothing capacitor 4 is a capacitor configured to rectify the electric power to be inputted to and outputted from the DC power supply 200.

The power module 5 is connected between the DC power supply 200 and the bus bars 6 through the power supply buses 11 and 21. The power module 5 is provided with multiple semiconductor switching elements inclusive of IGBTs or MOSFETs which are placed on a board. Here, the power module 5 is an inverter configured to change the electric power from the DC power supply by turning the semiconductor switching elements on and off on the basis of control signals from a not-illustrated controller, and to output the electric power to the electric motor 300 through the bus bars 6. The not-illustrated controller generates switching signals for the semiconductor switching elements by use of a torque command value corresponding to aperture of an accelerator of the vehicle, and outputs the switching signals to the power module 5. The semiconductor switching elements are switched on and off on the basis of the switching signals, so that the power module 5 can output the AC power for allowing the electric motor 300 to gain desired output torque. The power module 5 is electrically connected to the three-phase electric motor 300 by means of U-phase, V-phase, and W-phase output lines corresponding to the respective phases of the electric motor 300.

The bus bars 6 are formed from three conductive plates in a plate shape, which are made of a conductive material. The bus bars 6 connect the power module 5 to the shielded wires 8. Tip end portions of the bus bars 6 serve as terminals (tabs) of the power conversion device 100, and are connected to tip ends of the shielded wires 8, respectively.

Figure 3:
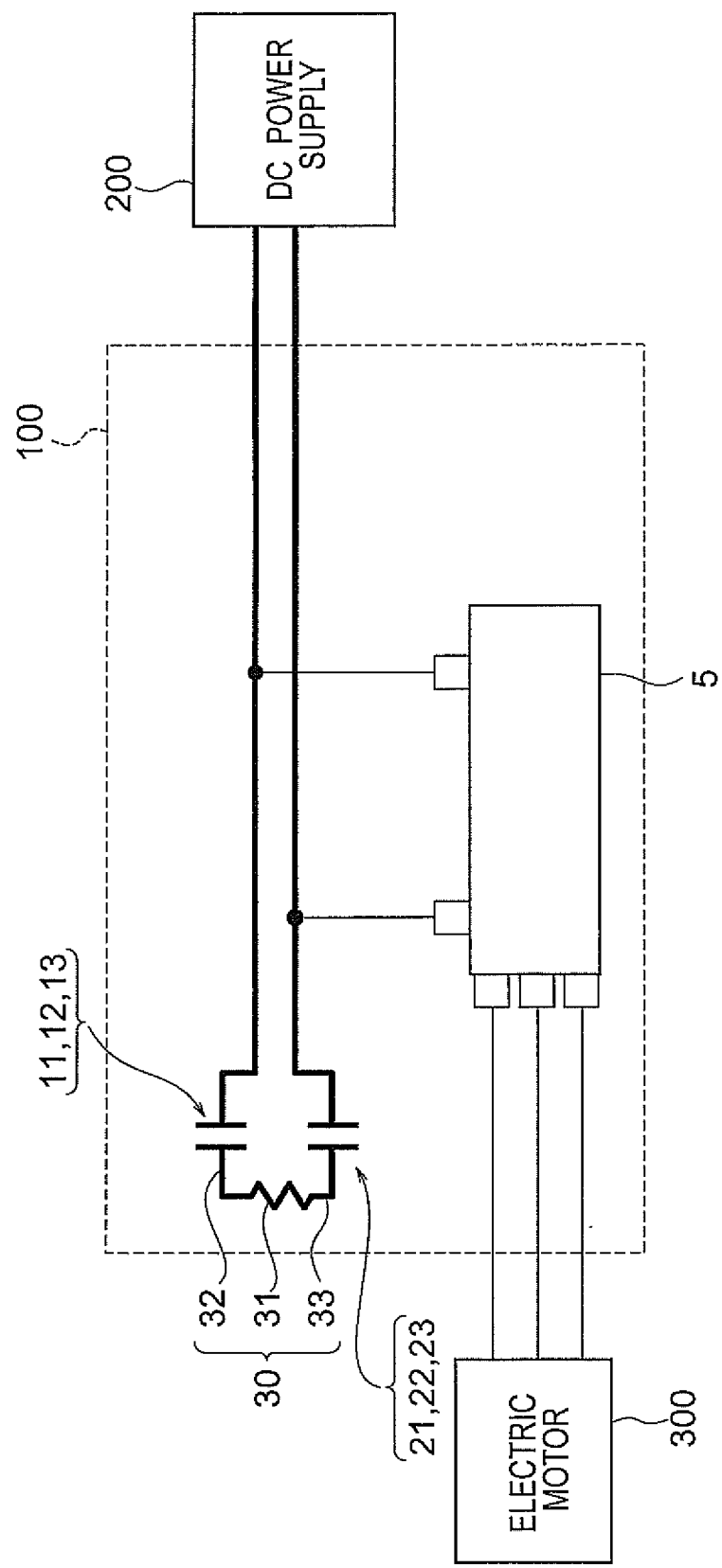
FIG. 3 is a schematic diagram of the drive system of FIG. 1, in which power supply buses 11 and 21, dielectric bodies 12 and 22, conductive bodies 13 and 23, and a connection circuit 30 are illustrated in the form of an equivalent circuit.

Next, operations of the power supply buses 11 and 21, the dielectric bodies 12 and 22, the conductive bodies 13 and 23, and the connection circuit 30 of this embodiment will be described by using FIG. 3. Note that illustration of part of the power conversion device 100 and the shielded wires 7 and 8 is omitted from FIG. 3.

As described previously, the conductive body 13 and the conductive body 23 are respectively located opposed to the power supply bus 11 and the power supply bus 21 while interposing the dielectric body 12 and the dielectric body 22 in between. Hence, the conductive bodies 13 and 23, the dielectric bodies 12 and 22, and the power supply buses 11 and 21 are represented as two capacitors as shown in FIG. 3. Moreover, the space between the power supply bus 11 and the power supply bus 21 is represented by an equivalent circuit designed to connect the capacitors and the resistor 31.

In the meantime, switching noise is generated when the switching elements included in the power module 5 are subjected to the switching operations. The switching noise grows to noise containing various frequencies that correspond to timings to switch the switching elements, and further to a generation source of noise in each power supply bus 11 or 21, which has a peak value at a specific frequency. For this reason, the switching noise is likely to leak from the power conversion device 100 to the outside. Moreover, if the frequency of the noise interferes with a frequency band of a car radio that is installed in the vehicle equipped with the power conversion device 100, the noise is also likely to render radio broadcast inaudible or to bring about jarring sounds to a user. Furthermore, the noise is also likely to adversely affect other electronic devices installed in the vehicle.

In this embodiment, the conductive body 13 and the conductive body 23 form the capacitors in conjunction with the power supply bus 11 and the power supply bus 21, respectively. Accordingly, if the switching noise from the power module 5 generates the noise in any of the power supply buses 11 and 21, the noise is used for induction by any of the capacitors. Then, a noise current thus induced by the capacitor on the basis of the noise is used by the resistor 31 for generating heat. Thus, this embodiment suppresses the noise and avoids the leakage of the noise from the power conversion device 100 to the outside.

Moreover, in this embodiment, a resistance value of the resistor 31 and capacitances of the capacitors formed from the power supply buses 11 and 21, the dielectric bodies 12 and 22, and the conductive bodies 13 and 23 are set in accordance with the frequency of the switching noise, and the switching-based noise is thus suppressed. Specifically, the switching noise contains multiple frequencies and the noise generated in the power supply bus 11 has the specific frequency attributed to the shape of the power supply bus 11. For this reason, it is possible to control a peak of the noise by setting the resistance value of the resistor 31 and the capacitance of the corresponding capacitor in accordance with a noise component so as to control a peak value of the noise having the specific frequency.

As described above, the power conversion device of this embodiment includes: the power supply bus 11 and the power supply bus 21 which are connected to the power module 5; the conductive body 13 and the conductive body 23 which form the capacitors in conjunction with the power supply bus 11 and the power supply bus 21, respectively; and the connection circuit 30 which includes the resistor and establishes electrical communication between the conductive body 13 and the conductive body 23. Thereby, the noise currents attributed to the noise generated in the power supply buses 11 and 21 by the switching of the power module 5 can be conducted to the capacitors. Thus, it is possible to accumulate electric charges in the capacitors and to use the electric charges with the resistor 31 for generating the heat. In other words, the noise can be used for induction and thus absorbed by the resistor 31. As a consequence, it is possible to suppress the noise and to avoid the leakage of the noise from the power conversion device 100 to the outside.

In this embodiment, the resistance value of the resistor 31 is set higher than the resistance value of the conductive body 13 or the conductive body 23. Thus, when the connection circuit 30 connects the conductive body 13 and the conductive body 23 together, it is possible to prevent a short circuit between the conductive bodies 13 and 23 and to suppress the noise.

The power conversion device 100 of this embodiment includes the dielectric body 12 provided between the power supply bus 11 and the conductive body 13, and the dielectric body 22 provided between the power supply bus 21 and the conductive body 23. This configuration increases each electrostatic capacitances between the power supply buses 11 and 21 and the conductive bodies 13 and 23, respectively, and can thus enhance a noise suppression effect. Moreover, in this embodiment, the conductive bodies 13 and 23 are located in the vicinities of the power supply buses 11 and 21 via the dielectric bodies 12 and 22, respectively. Thus, it is possible to increase the electrostatic capacitances between the power supply buses 11 and 21 and the conductive bodies 13 and 23, respectively, and thus to enhance the noise suppression effect.

In addition, each of the conductive bodies 13 and 23 is made from the metal tape. Thus, the conductive bodies 13 and 23 can be formed easily.

In this embodiment, the resistance value of the resistor 31 or the capacitances of the capacitors are set in accordance with the frequency of the noise generated in the power supply bus 11 and 21 by the switching operation of the power module 5. Thus, the capacitors and the resistor 31 can absorb the noise in accordance with the peak of the noise generated by the switching operation, and thereby suppressing the noise.

Figure 4:
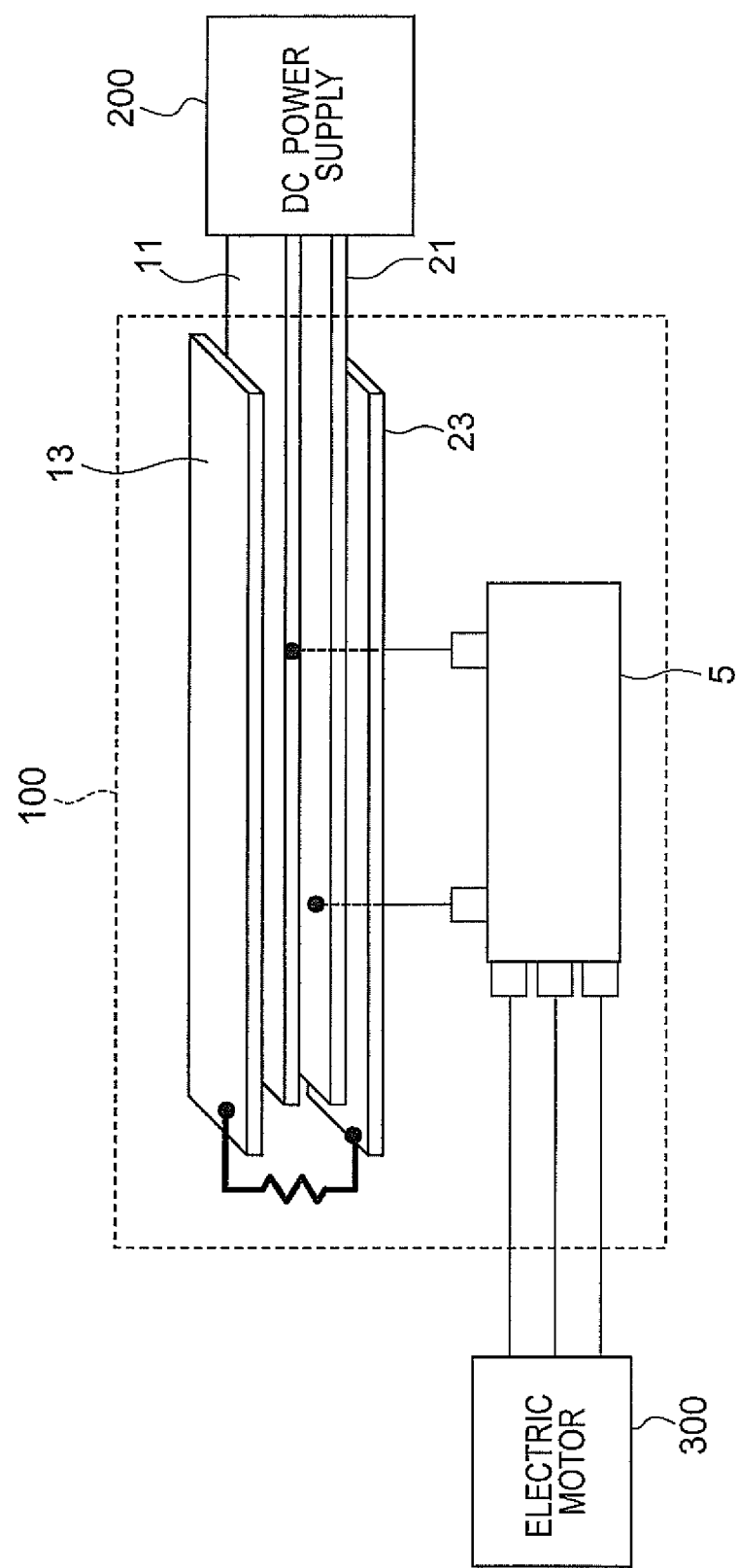
FIG. 4 is a schematic diagram of a drive system for an electric vehicle including a power conversion device 100 according to a modified example of the embodiment of the present invention.

In this embodiment, the dielectric bodies 12 and 22 are sandwiched between the power supply bus 11 and the conductive body 13 as well as between the power supply bus 21 and the conductive body 23, respectively. However, as shown in FIG. 4, the dielectric bodies 12 and 22 are not indispensable. Note that illustration of part of the power conversion device 100 and the shielded wires 7 and 8 is omitted from FIG. 4.

The power module 5 corresponds to an "inverter" according to the present invention. The power supply bus 11 corresponds to a "first power supply bus" of the present invention. The power supply bus 21 corresponds to a "second power supply bus" of the present invention. The conductive body 13 corresponds to a "first conductive body" of the present invention. The conductive body 23 corresponds to a "second conductive body" of the present invention. The dielectric body 12 corresponds to a "first dielectric body" of the present invention. The dielectric body 22 corresponds to a "second dielectric body" of the present invention.

Second Embodiment

Figure 5:
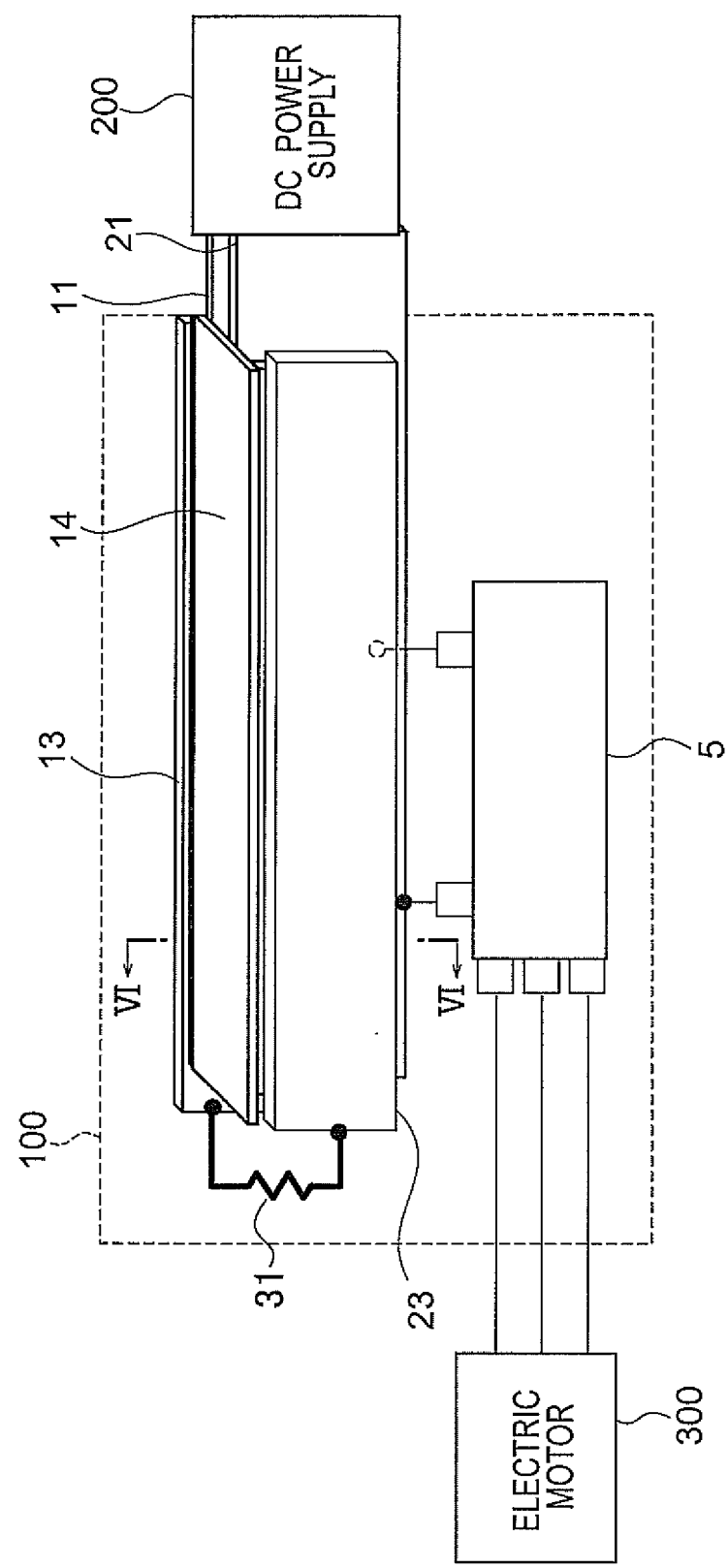
FIG. 5 is a schematic diagram of a drive system for an electric vehicle including a power conversion device according to another embodiment of the present invention.
Figure 6:
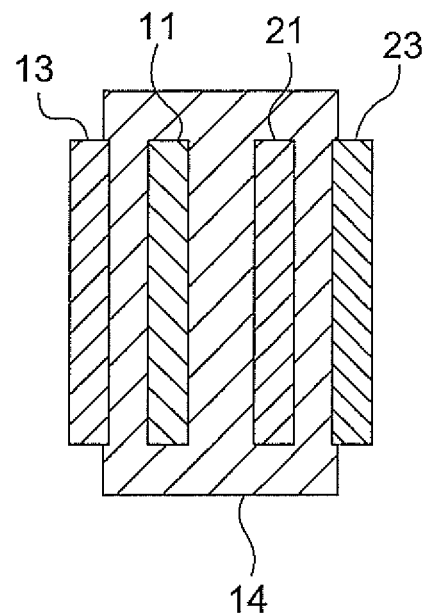
FIG. 6 is a cross-sectional diagram of the drive system taken along the VI-VI line of FIG. 5.

A drive system for an electric vehicle including a power conversion device according to another embodiment of the present invention will be described with reference to FIG. 5 and FIG. 6. This embodiment includes a dielectric body having a different configuration from the configuration of the dielectric bodies in the above-described first embodiment. Since the configurations other than the above are the same as those of the above-described first embodiment, the descriptions of the first embodiment will be incorporated herein as appropriate.

A dielectric body 14 is made from a resin provided between the power supply bus 11 and the conductive body 13 as well as between the power supply bus 21 and the conductive body 23 while covering surfaces of the power supply bus 11 and the power supply bus 21. The dielectric body 14 is held between the conductive body 13 and the conductive body 23. In other words, part of the outer periphery of the power supply bus 11 is covered with the dielectric body 14, part of the outer periphery of the power supply bus 21 is covered with the dielectric body 14, and the dielectric body 14 is also held between the power supply bus 11 and the power supply bus 21. Thus, the conductive body 13 and the power supply bus 11 collectively form a capacitor while the conductive body 23 and the power supply bus 21 collectively form a capacitor.

Figure 7:
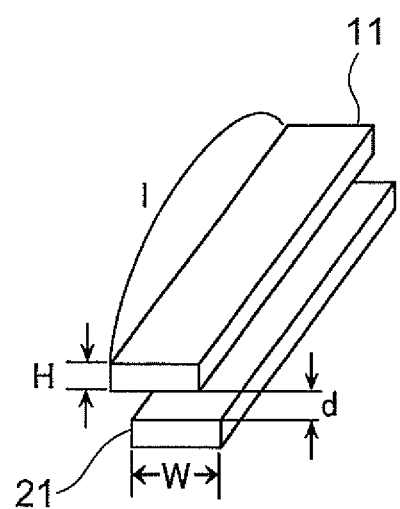
FIG. 7 is a perspective diagram, of power supply buses 11 and 21 of FIG. 5.
Figure 8:
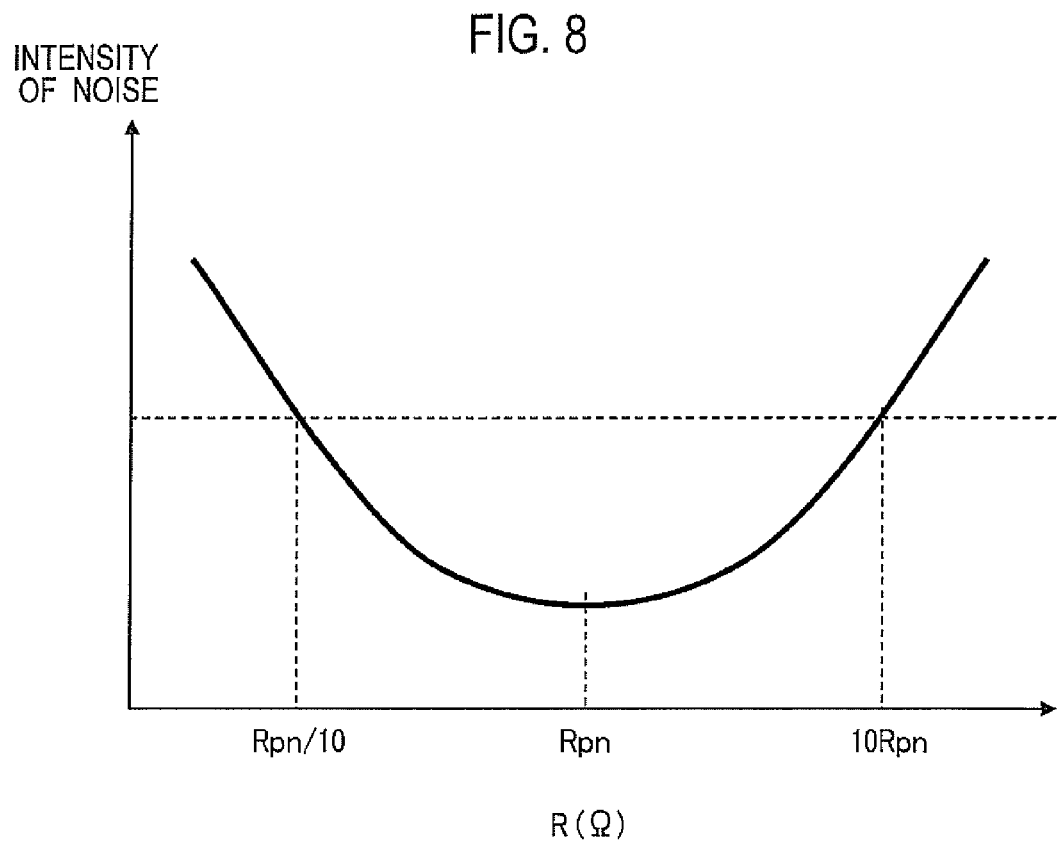
FIG. 8 is a graph showing a noise characteristic with respect to a resistance value of a resistor 31 of FIG. 5.
Figure 9:
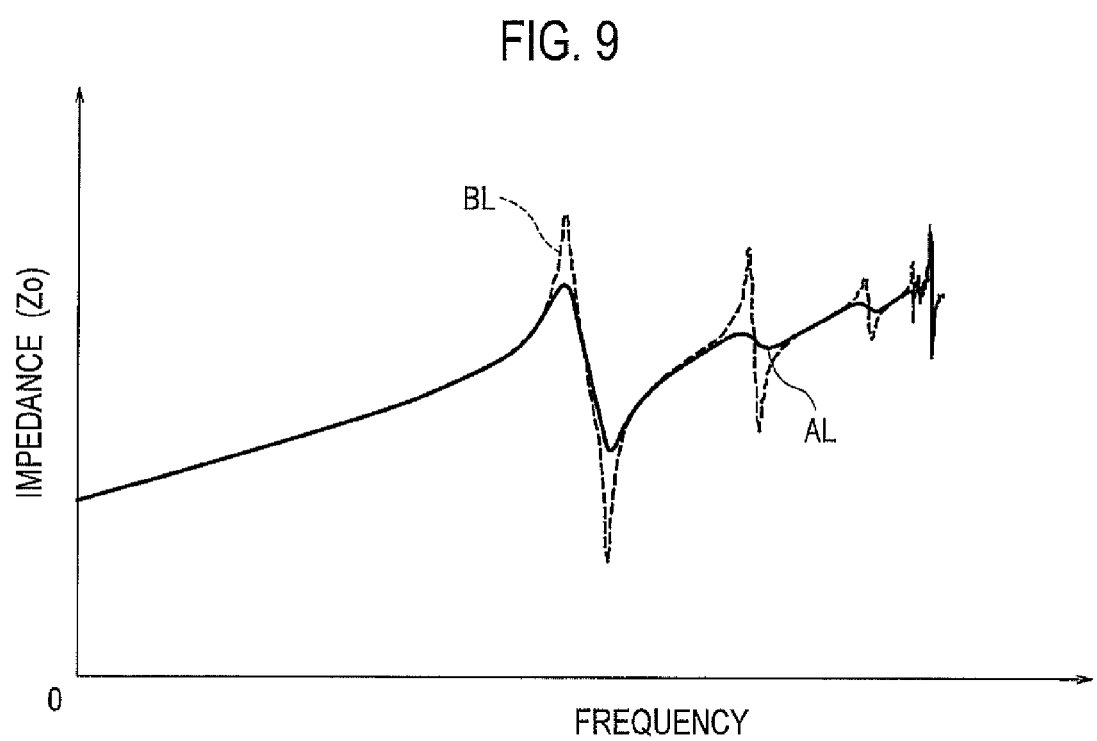
FIG. 9 is a graph showing impedance characteristics of the power supply buses 11 and 21 with respect to a noise frequency, which is observed in the drive system of FIG. 5.

Here, a method of setting the resistance value of the resistor 31 of this embodiment will be described by using FIG. 7 to FIG. 9. In FIG. 7, the length of the power supply buses 11 and 21 is denoted by I, their width is denoted by w, their height is denoted by H, and a distance between the power supply bus 11 and the power supply bus 21 is denoted by d.

If an inductance component between the power supply bus 11 and the power supply bus 21 is Lpn and a capacitance component therebetween is Cpn, then as shown in following formula (1), a resistance value (Rpn) of the power supply buses 11 and 21 is approximated to a value which is proportional to a square root of the inductance component (Lpn) and inversely proportional to a square root of the capacitance component (Cpn).

[Formula 1]
$$R_{pn} \approx \sqrt{\frac{L_{pn}}{C_{pn}}} \quad (1)$$

Meanwhile, a self-inductance (Lo) and a mutual inductance (Mo) between the power supply bus 11 and the power supply bus 21 are expressed by the formula 2 and the formula 3 shown below.

[Formula 2]
$$Lo \approx \frac{\mu_0 l}{2\pi}\left[\ln\left(\frac{2l}{w+H}\right) + \frac{1}{2} + \frac{0.2235(w+H)}{l}\right] \quad (2)$$

[Formula 3]
$$Mo \approx \frac{\mu_0 l}{2\pi}\left[\ln\left(\frac{2l}{d}\right) - 1 + \frac{d}{l}\right] \quad (3)$$

When the length (I) is sufficiently longer than the distance (d), the capacitance component (Cpn) between the power supply bus 11 and the power supply bus 21 becomes dominant as compared to the inductance component (Lpn=2 (Lo−Mo)) between the power supply bus 11 and the power supply bus 21 in the formula (1).

If a relative permittivity between the power supply bus 11 and the power supply bus 21 is denoted by ∈r, a dielectric constant of the vacuum therebetween is denoted by ∈0, and the area of each of the surfaces of the power supply bus 11 and the power supply bus 21 facing each other is denoted by S, then the capacitance component (Cpn) is approximated by the following formula (4).

[Formula 4]
$$C_{pn} \approx \varepsilon_0 \varepsilon_r \frac{S}{d} \quad (4)$$

Then, the following formula (5) is derived by assigning the formula (4) to the formula (1).

[Formula 5]

$$R_{pn} \approx \sqrt{\frac{L_{pn} \cdot d}{\varepsilon_0 \varepsilon_r S}} \quad (5)$$

Specifically, the resistance value (Rpn) of the power supply buses 11 and 21 is approximated to a value which is proportional to a square root of the distance (d) and inversely proportional to a square root of the area (S).

In order to make the connection circuit 30 exert a noise reduction effect, it is preferable to adjust the resistance value of the resistor 31 on the basis of the resistance value of the power supply buses 11 and 21. FIG. 8 shows a noise characteristic when the resistance value of the resistor 31 is changed with a central focus on the resistance value (Rpn) of the power supply buses 11 and 21. In FIG. 8, the horizontal axis indicates the resistance value of the resistor 31 and the vertical axis indicates the intensity of the noise. The noise is reduced most in the case where the resistance value of the resistor 31 is set equal to the resistance value (Rpn) of the power supply buses 11 and 21. Here, the noise can be reduced at least by setting the resistance value of the resistor 31 in a range from a resistance value (Rpn/10) to a resistance value (10Rpn).

Next, with reference to FIG. 9, a description will be given of impedance characteristics with respect to the frequency of the switching noise generated by the switching operations of the switching elements included in the power module 5. Here, the impedance of the capacitors and the connection circuit 30 from the viewpoint of the power supply buses 11 and 21 is denoted by Zo. A solid line AL of FIG. 9 indicates an impedance characteristic when the resistance value (R) of the resistor 31 is adjusted on the basis of the resistance value (Rpn) of the power supply buses 11 and 21 (R≈Rpn). A dashed line BL of FIG. 9 indicates an impedance characteristic either when the resistance value of the resistor 31 is sufficiently greater than the resistance value (Rpn) of the power supply buses 11 and 21 (R>>Rpn) or when the resistance value of the resistor 31 is sufficiently smaller than the resistance value (Rpn) of the power supply buses 11 and 21 (R<<Rpn).

As indicated with the dashed line BL, a sharp resonance is observed when the resistance value of the resistor 31 is either sufficiently greater or sufficiently smaller than the resistance value (Rpn) of the power supply buses 11 and 21. Here, an amount of change in impedance becomes large at each resonance point. On the other hand, as indicated with the solid line AL, the resonance becomes dull when the resistance value (R) of the resistor 31 is approximate to the resistance value (Rpn) of the power supply buses 11 and 21 (R≈Rpn). Here, the amount of change in impedance becomes small at each resonance point. Thus, the noise at the frequency corresponding to the resonance point is suppressed. Accordingly, the noise can be suppressed by setting the resistance value (R) of the resistor 31 on the basis of the resistance value (Rpn) of the power supply buses 11 and 21. Meanwhile, even when a frequency band such as a radio broadcast frequency that should be prevented from interference is allocated near the resonance point, the amount of change in the impedance (Zo) at the resonance frequency can be suppressed by adjusting the resistance value (R) of the resistor 31 on the basis of the resistance value (Rpn) of the power supply buses 11 and 21. As a consequence, the noise in the frequency band can be suppressed.

As described above, this embodiment includes the dielectric body 14 made from the resin, which is provided between the power supply bus 11 and the conductive body 13 as well as between the power supply bus 21 and the conductive body 23 while partially covering the surfaces of the power supply bus 11 and the power supply bus 21. Accordingly, the surfaces of the power supply bus 11 and the power supply bus 21 are partially molded with the resin. When the conductive bodies 13 and 23 are positioned such that the conductive bodies 13 and 23 and the power supply buses 11 and 21 form the capacitors, the conductive bodies 13 and 23 only need to be disposed on surfaces of the dielectric body 14. Thus, it is possible to facilitate the positioning of the conductive bodies 13 and 23 with respect to the power supply buses 11 and 21, and consequently to suppress the noise generated in the power supply buses 11 and 21.

In addition, the resistance value of the resistor 31 is set at the value which is proportional to the square root of the inductance component between the power supply bus 11 and the power supply bus 21 and inversely proportional to the square root of the capacitance component between the power supply bus 11 and the power supply bus 21. Thus, it is possible to suppress the noise generated in the power supply buses 11 and 21, and to avoid the leakage of the noise from the power conversion device 100 to the outside.

Moreover, in this embodiment, the resistance value of the resistor 31 is set at the value which is proportional to the square root of the distance between the power supply bus 11 and the power supply bus 21 and inversely proportional to the square root of either the area of the opposed surface of the power supply bus 11 facing the power supply bus 21 or the area of the opposed surface of the power supply bus 21 facing the power supply bus 11. Thus, it is possible to suppress the noise generated in the power supply buses 11 and 21, and to avoid the leakage of the noise from the power conversion device 100 to the outside.

In this embodiment, the dielectric body 14 is integrated and thus configured to cover the power supply bus 11 and the power supply bus 21. Instead, a configuration may be adopted in which: the dielectric body 14 is divided into pieces; and the divided pieces of the dielectric bodies 14 covers part of the power supply bus 11 and part of the power supply bus 21, respectively.

The above-described dielectric body 14 corresponds to the "first dielectric body" and the "second dielectric body" of the present invention.

Third Embodiment

Figure 10:
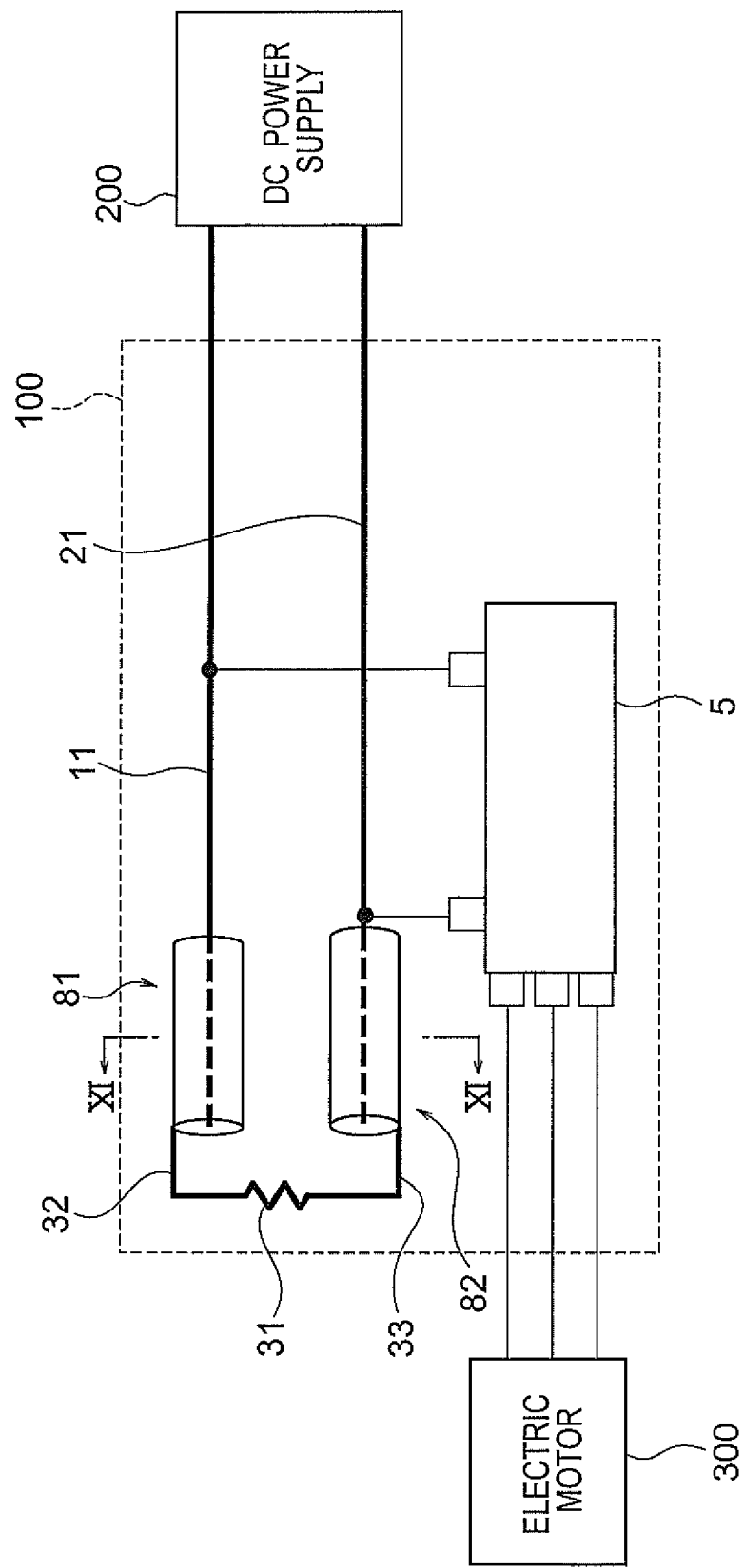
FIG. 10 is a schematic diagram of a drive system for an electric vehicle including a power conversion device according to another embodiment of the present invention.
Figure 11:
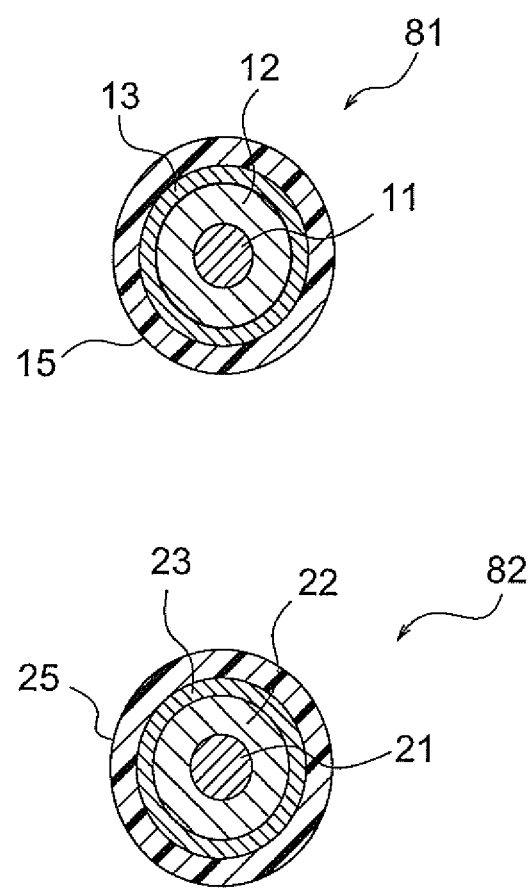
FIG. 11 is a cross-sectional diagram of the drive system taken along the XI-XI line of FIG. 10.

A drive system for an electric vehicle including a power conversion device according to another embodiment of the present invention will be described with reference to FIG. 10 and FIG. 11. In this embodiment, a configuration of a connecting portion between the power supply buses 11 and 21 and the lines 32 and 33, respectively, is different from that of the above-described first embodiment. Since the configurations other than the above are the same as those of the above-described first embodiment, the descriptions of the first embodiment or the second embodiment will be incorporated herein as appropriate.

Of the end portions of the power supply buses 11 and 21, cylindrical cable units 81 and 82, which have the power supply buses 11 and 21 as their central lines, are respectively formed in the end portions opposite the DC power supply 200. Capacitors are formed in the cable units 81 and 82.

The cable unit 81 includes the power supply bus 11, the dielectric body 12, the conductive body 13, and an insulating portion 15. The power supply bus 11, the dielectric body 12, the conductive body 13, and the insulating portion 15 are each formed in a cylindrical shape and concentrically arranged around the center of an axis on a cross section taken in a perpendicular direction. The power supply bus 11 serves as the center of the axis of the cable unit 81. The dielectric body 12 is formed coaxially with the power supply bus 11 to cover the outer periphery of the power supply bus 11. The conductive body 13 is formed coaxially with the power supply bus 11 to cover the outer periphery of the dielectric body 12. The insulating portion 15 is formed coaxially with the power supply bus 11 to cover the outer periphery of the conductive body 13. Thereby, the dielectric body 12 is sandwiched between the power supply bus 11 and the conductive body 13. Thus, the conductive body 13 and the power supply bus 11 collectively form a capacitor.

The cable unit 82 includes the power supply bus 21, the dielectric body 22, the conductive body 23, and an insulating portion 25. The power supply bus 21, the dielectric body 22, the conductive body 23, and the insulating portion 25 are each formed in a cylindrical shape and coaxially arranged. The power supply bus 21 serves as the center of an axis of the cable unit 82. The dielectric body 22 is formed coaxially with the power supply bus 21 to cover the outer periphery of the power supply bus 21. The conductive body 23 is formed coaxially with the power supply bus 21 to cover the outer periphery of the dielectric body 22. The insulating portion 25 is formed coaxially with the power supply bus 21 to cover the outer periphery of the conductive body 23. Thereby, the dielectric body 22 is sandwiched between the power supply bus 21 and the conductive body 23. Thus, the conductive body 23 and the power supply bus 21 collectively form a capacitor.

The line 32 is connected to the conductive body 13 while the line 33 is connected to the conductive body 23.

As described above, in this embodiment, each of the cable units 81 and 82 is provided at one end of the corresponding power supply bus 11 or 21. Then, the power supply buses 11 and 21 are used as the centers of the axes of the cable units 81 and 82 while the conductive bodies 13 and 23 are used as the conductive bodies located outside the centers of the axes of the corresponding cable units 81 and 82, respectively. Thereby, the capacitors are formed in the cable units 81 and 82. Thus, it is possible to prevent parasitic capacitances from affecting the noise in conduction paths from the power supply buses 11 and 21 to the lines 32 and 33, respectively, and to suppress the noise generated in the power supply buses 11 and 21, as well as to avoid the leakage of the noise from the power conversion device 100 to the outside.

Fourth Embodiment

Figure 12:
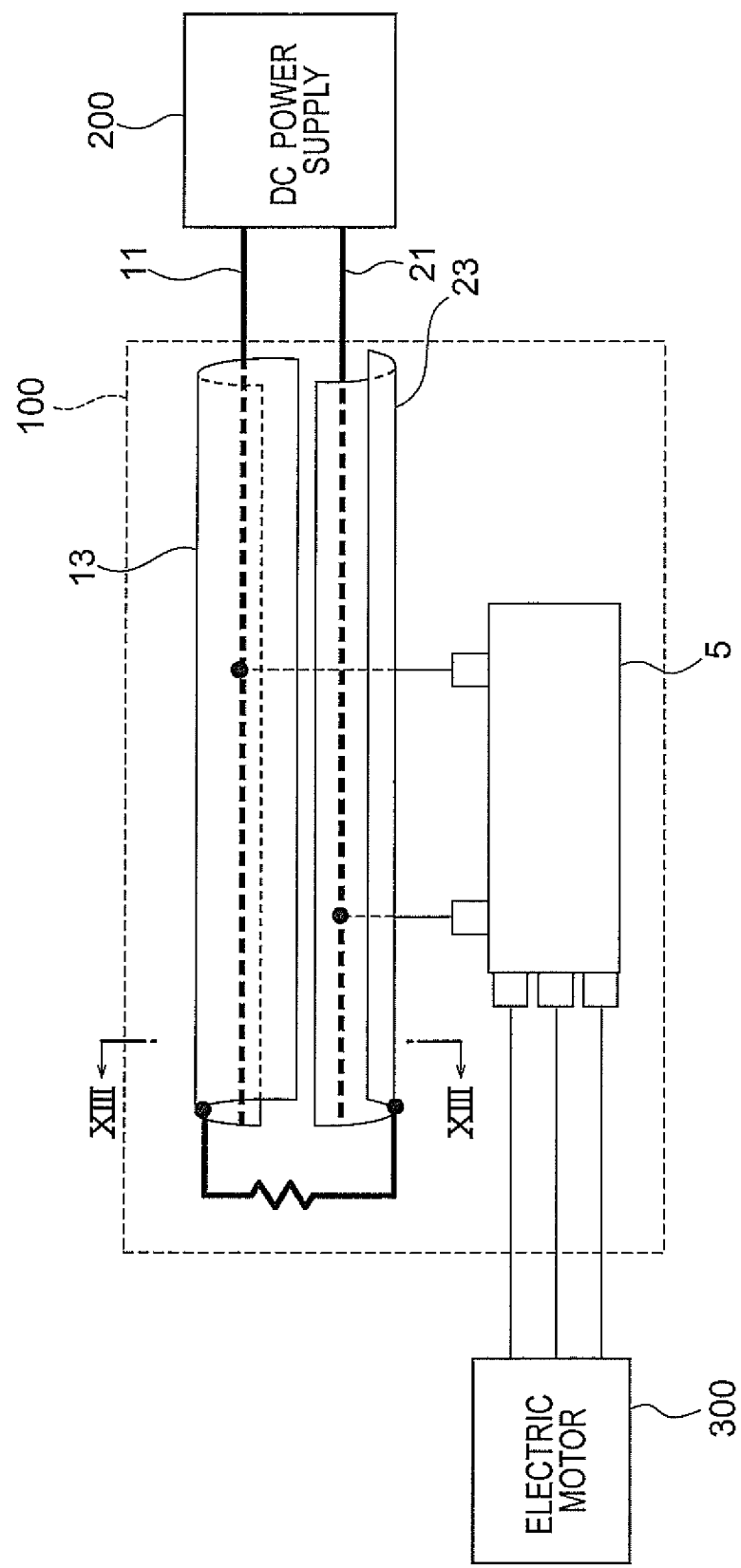
FIG. 12 is a schematic diagram of a drive system for an electric vehicle including a power conversion device according to another embodiment of the present invention.
Figure 13:
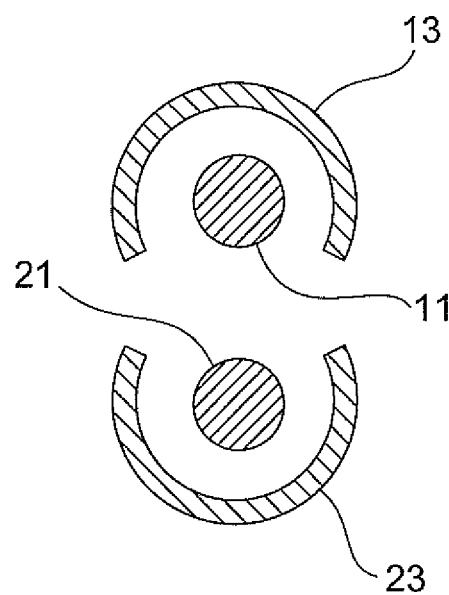
FIG. 13 is a cross-sectional diagram of the drive system taken along the XIII-XIII line of FIG. 12.

A drive system for an electric vehicle including a power conversion device according to another embodiment of the present invention will be described with reference to FIG. 12 and FIG. 13. In this embodiment, configurations of the power supply buses 11 and 21 and the conductive bodies 13 and 23 are different from those of the above-described first embodiment. Since the configurations other than the above are the same as those of the above-described first embodiment, the descriptions of the first embodiment or the second embodiment will be incorporated herein as appropriate.

Each of the power supply buses 11 and 21 is formed in a cylindrical line shape. One end of each power supply bus 11 or 21 is connected to the DC power supply 200 and the other end thereof is left open. Each of the conductive bodies 13 and 23 is formed in such a manner as to cover the power supply bus 11 or 21 while retaining a predetermined distance from the power supply bus 11 or 21. Each of the conductive bodies 13 and 23 has a columnar shape made by bending a plate-shaped conductive body, and is formed coaxially with the power supply bus 11 or 21 and in such a manner as to form an arc shape around an axis on a cross section taken in a perpendicular direction. Since a gap is formed between each power supply bus 11 or 21 and each conductive body 13 or 23, each conductive body 13 or 23 and each power supply bus 11 or 21 collectively form a capacitor.

As described above, in this embodiment, each power supply bus 11 or 21 is formed in the cylindrical line shape, and each conductive body 13 or 23 is formed in the columnar shape by bending the flat plate in such a manner as to cover a side surface of the power supply bus 11 or 21. Thereby, part of the side surface of the power supply bus 11 or 21 is covered with the conductive body 13 or 23, whereby each conductive body 13 or 23 acts to shield the noise. Thus, the leakage of the noise generated in the power supply buses 11 and 21 can be avoided. As a consequence, it is possible to suppress the noise generated in the power supply buses 11 and 21 and to avoid the leakage of the noise from the power conversion device 100 to the outside.

Fifth Embodiment

Figure 14:
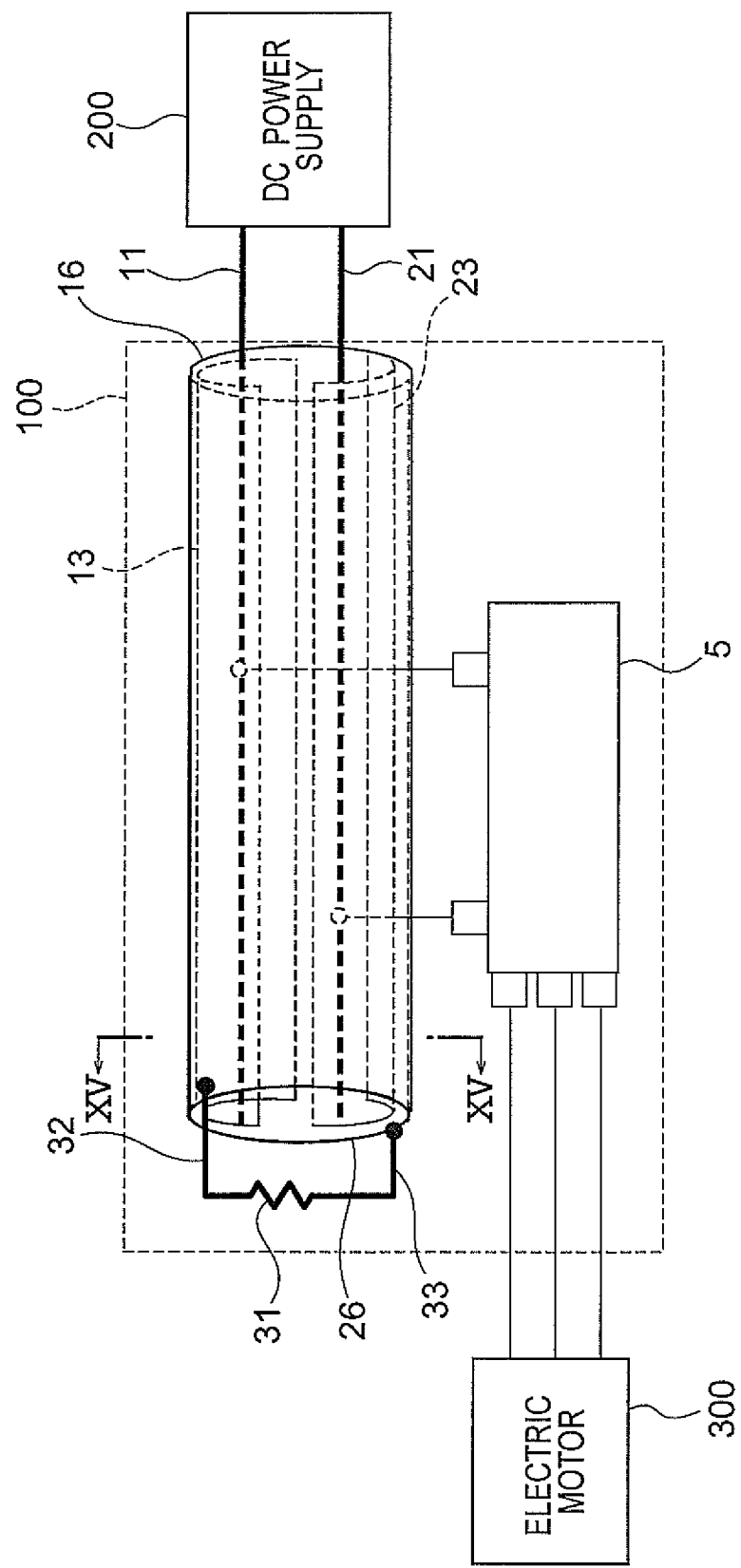
FIG. 14 is a schematic diagram of a drive system for an electric vehicle including a power conversion device according to another embodiment of the present invention.
Figure 15:
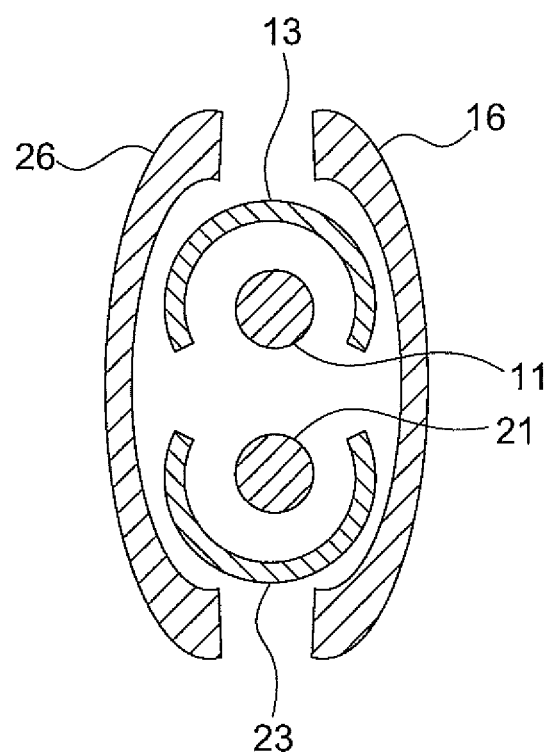
FIG. 15 is a cross-sectional diagram of the drive system taken along the XV-XV line of FIG. 14.

A drive system for an electric vehicle including a power conversion device according to another embodiment of the present invention will be described with reference to FIG. 14 and FIG. 15. This embodiment is different from the above-described fourth embodiment in that conductive bodies 16 and 26 are further provided in this embodiment. Since the configurations other than the above are the same as those of the above-described fourth embodiment, the descriptions of the fourth embodiment will be incorporated herein as appropriate.

The columnar-shaped conductive bodies 16 and 26 are further provided outside the conductive bodies 13 and 23. Each of the conductive bodies 16 and 26 is formed in the columnar shape by bending a flat plate in such a manner as to cover the side surfaces of the power supply buses 11 and 21. Moreover, the conductive bodies 16 and 26 are disposed in such a manner as to cover gaps between the conductive body 13 and the conductive body 23. The conductive bodies 16 and 26 are connected to the lines 32 and 33, respectively. Thus, each conductive body 16 or 26 and each power supply bus 11 or 21 collectively form a capacitor.

As described above, in addition to the conductive bodies 13 and 23, this embodiment includes the conductive bodies 16 and 26 which form the capacitors in conjunction with the power supply buses 11 and 21, and the conductive bodies 16 and 26 are disposed in such a manner as to cover the gaps between the conductive body 13 and the conductive body 23. Thereby, the conductive bodies 16 and 26 act to shield the noise. Thus, the leakage of the noise generated in the power supply buses 11 and 21 can be avoided. In addition, since the conductive bodies 16 and 26 and the power supply buses 11 and 21 form the capacitors, it is possible to suppress the noise generated in the power supply buses 11 and 21.

Sixth Embodiment

Figure 16:
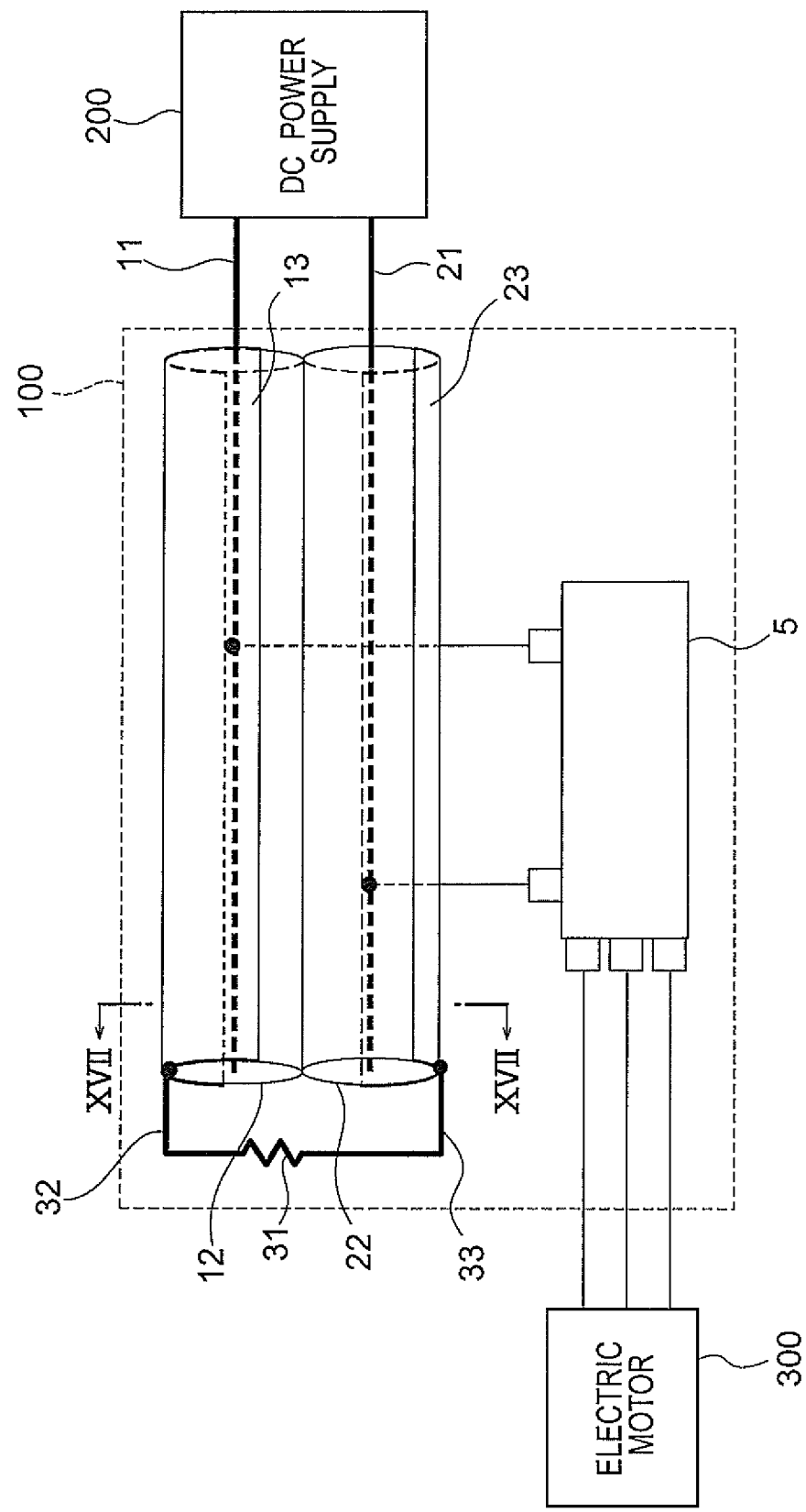
FIG. 16 is a schematic diagram of a drive system for an electric vehicle including a power conversion device according to another embodiment of the present invention.
Figure 17:
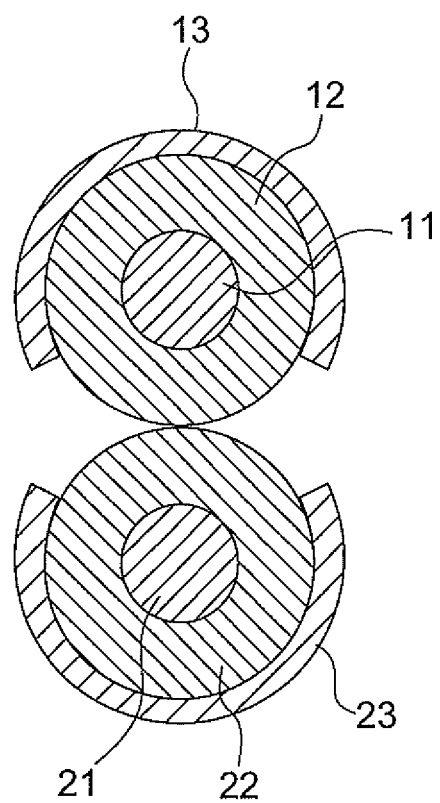
FIG. 17 is a cross-sectional diagram of the drive system taken along the XVII line of FIG. 16.

A drive system for an electric vehicle including a power conversion device according to another embodiment of the present invention will be described with reference to FIG. 16 and FIG. 17. This embodiment is different from the above-described fourth embodiment in that conductive bodies 12 and 22 are provided in this embodiment. Since the configurations other than the above are the same as those of the above-described fourth embodiment, the descriptions of the fourth embodiment will be incorporated herein as appropriate.

The cylindrical dielectric bodies 12 and 22 are formed in such a manner as to cover the side surfaces of the outer peripheries of the power supply buses 11 and 21 each formed in the cylindrical line shape, and the conductive bodies 13 and 23 are formed in such a manner as to cover parts of side surfaces of the outer peripheries of the dielectric bodies 12 and 22. Thereby, each dielectric body 12 or 22 is sandwiched between each power supply bus 11 or 21 and each conductive body 13 or 23. Thus, each conductive body 13 or 23 and each power supply bus 11 or 21 collectively form a capacitor.

As described above, this embodiment includes the cylindrical dielectric bodies 12 and 22, which are located between the power supply buses 11 and 21 and the conductive bodies 13 and 23, respectively, and configured to cover the side surfaces of the outer peripheries of the power supply buses 11 and 21. Moreover, the conductive bodies 13 and 23 are disposed in such a manner as to cover the parts of the side surfaces of the outer peripheries of the dielectric bodies 12 and 22. Thereby, parts of the side surfaces of the power supply buses 11 and 21 are covered with the conductive bodies 13 and 23 while interposing the dielectric bodies 12 and 22 in between, and the conductive bodies 13 and 23 thereby act to shield the noise. Thus, the leakage of the noise can be avoided. As a consequence, it is possible to suppress the noise generated in the power supply buses 11 and 21 and to avoid the leakage of the noise from the power conversion device 100 to the outside.

Seventh Embodiment

A drive system for an electric vehicle including a power conversion device according to another embodiment of the present invention will be described with reference to FIG. 18. In this embodiment, the shapes of the power supply buses 11 and 21 and the shapes of the conductive bodies 13 and 23 are different from those in the above-described first embodiment. Since the configurations other than the above are the same as those of the above-described first embodiment, the descriptions of the first to sixth embodiments will be incorporated herein as appropriate.

Figure 18:
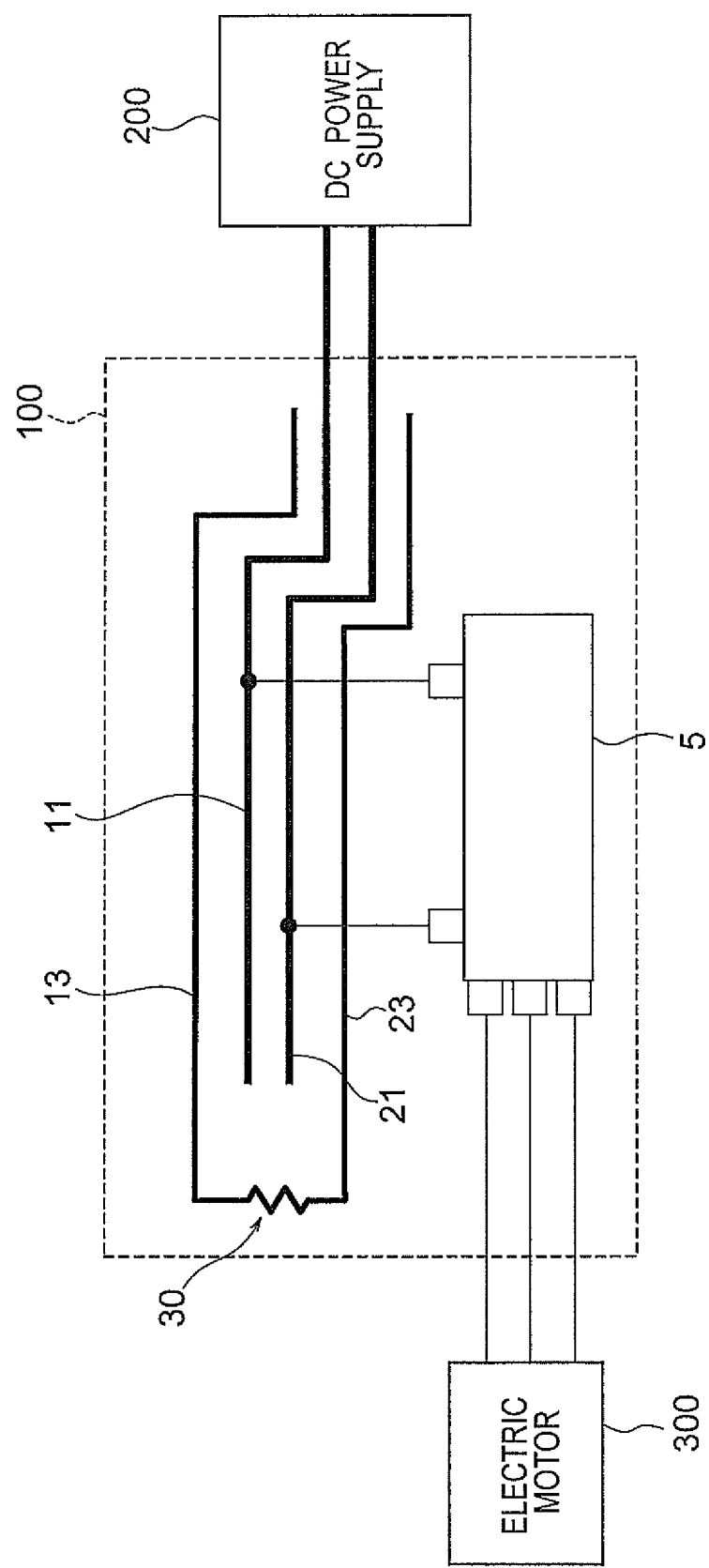
FIG. 18 is a schematic diagram of a drive system for an electric vehicle including a power conversion device according to another embodiment of the present invention.

As shown in FIG. 18, each of the power supply buses 11 and 21 is formed from a conductive plate in a plate shape. Each power supply bus 11 or 21 is bent at two positions each at a right angle. Each of the conductive bodies 13 and 23 is made from a metal tape, each bent at two positions at a right angle, and thus formed in the same shape as part of the power supply bus 11 or 21. In other words, part of a flat surface of each power supply bus 11 or 21, inclusive of an open end of the power supply bus 11 or 21 and the bent portions of the power supply bus 11 or 21, is opposed to a flat surface portion of the corresponding conductive body 13 or 23. Thus, each conductive body 13 or 23 inclusive of its bent portions and each power supply bus 11 or 21 inclusive of its bent portions collectively form a capacitor.

As described above, this embodiment includes: the power supply buses 11 and 21 each formed from the conductive plate in the bent plate shape; and the conductive bodies 13 and 23 formed in the same shape as part of the shapes of the power supply buses 11 and 21 and opposed to the flat surface portions of the power supply buses 11 and 21. Thus, each capacitor is formed between the conductive body 13 or 23 and the power supply bus 11 or 21. For this reason, it is possible to suppress the noise generated in the power supply buses 11 and 21 and to avoid the leakage of the noise from the power conversion device 100 to the outside.

In this embodiment, the dielectric bodies 12 and 22 may also be provided between the power supply bus 11 and the conductive body 13 as well as between the power supply bus 21 and the conductive body 23.

Eighth Embodiment

Figure 19:
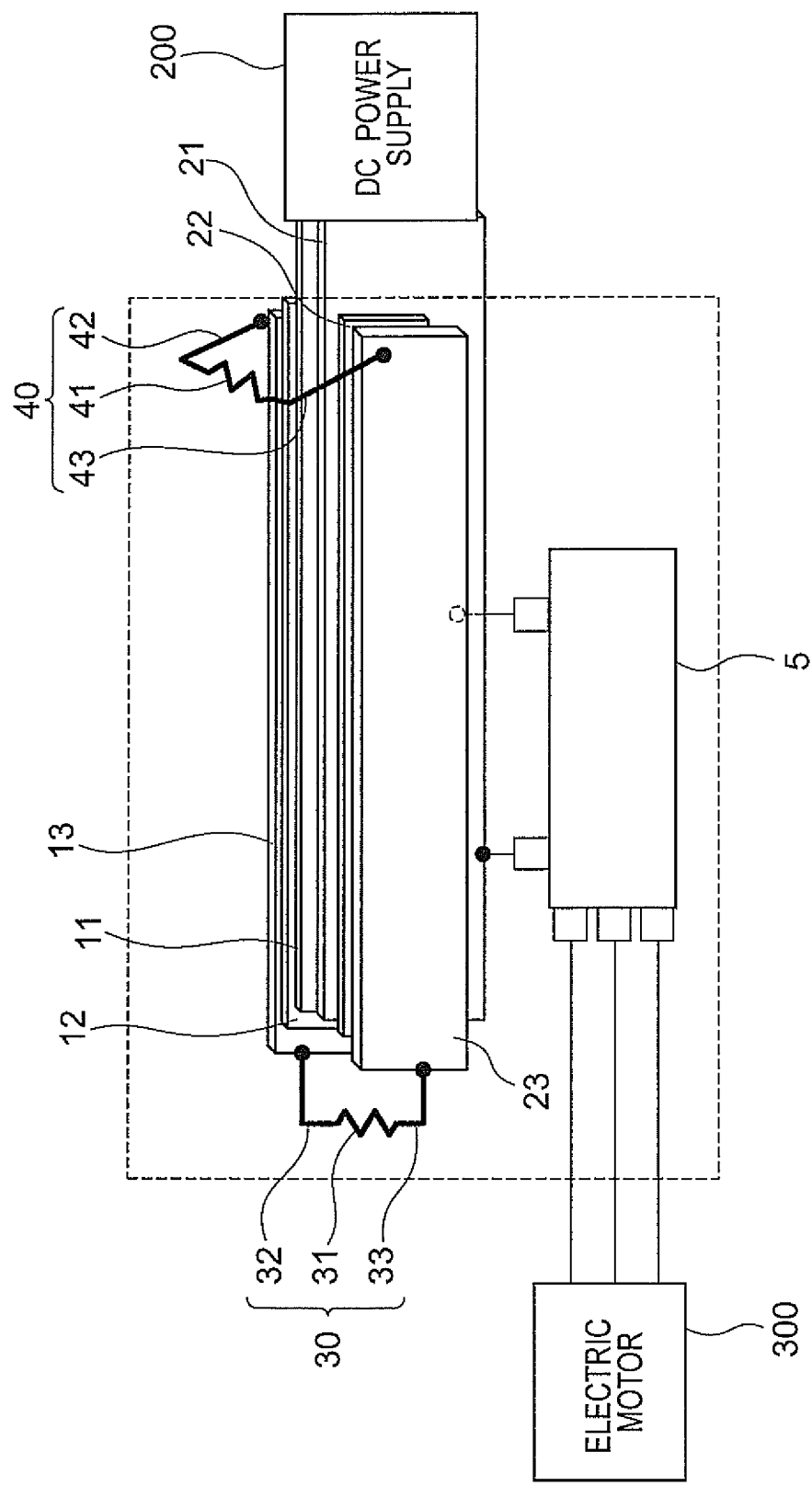
FIG. 19 is a schematic diagram, of a drive system for an electric vehicle including a power conversion device according to another embodiment of the present invention.

A drive system for an electric vehicle including a power conversion device according to another embodiment of the present invention will be described with reference to FIG. 19. This embodiment is different from the above-described first embodiment in that a connection circuit 40 is provided in this embodiment. Since the configurations other than the above are the same as those of the above-described first embodiment, the descriptions of the first to seventh embodiments will be incorporated herein as appropriate.

The connection circuit 40 includes a resistor 41, and lines 42 and 43. As is the case with the connection circuit 30, the connection 40 connects the conductive body 13 and the conductive body 23 together. The connection circuit 30 is connected to one end of the conductive body 13 and one end of the conductive body 23, while the connection circuit 40 is connected to the other end of the conductive body 13 and the other end of the conductive body 23. As is the case with the resistor 31, a resistance value of the resistor 41 is set in accordance with the noise component of the noise generated in the power supply buses 11 and 21, and is adjusted on the basis of the resistance value of the power supply buses 11 and 21.

As described above, in the power conversion device of this embodiment, the connection circuits 30 and 40 respectively including the resistors 31 and 41 are connected between the conductive body 13 and the conductive body 23. Accordingly, the two resistors 31 and 41 are connected between the conductive body 13 and the conductive body 23. Thus, the noise current induced by any of the capacitors from the noise generated in the power supply buses 11 and 12 can be used by the two resistors for generating heat. Thus, it is possible to shorten the time needed for suppressing the noise. In addition, it is possible to disperse modes of the noise and thus to enhance the noise suppression effect.

Figure 20:
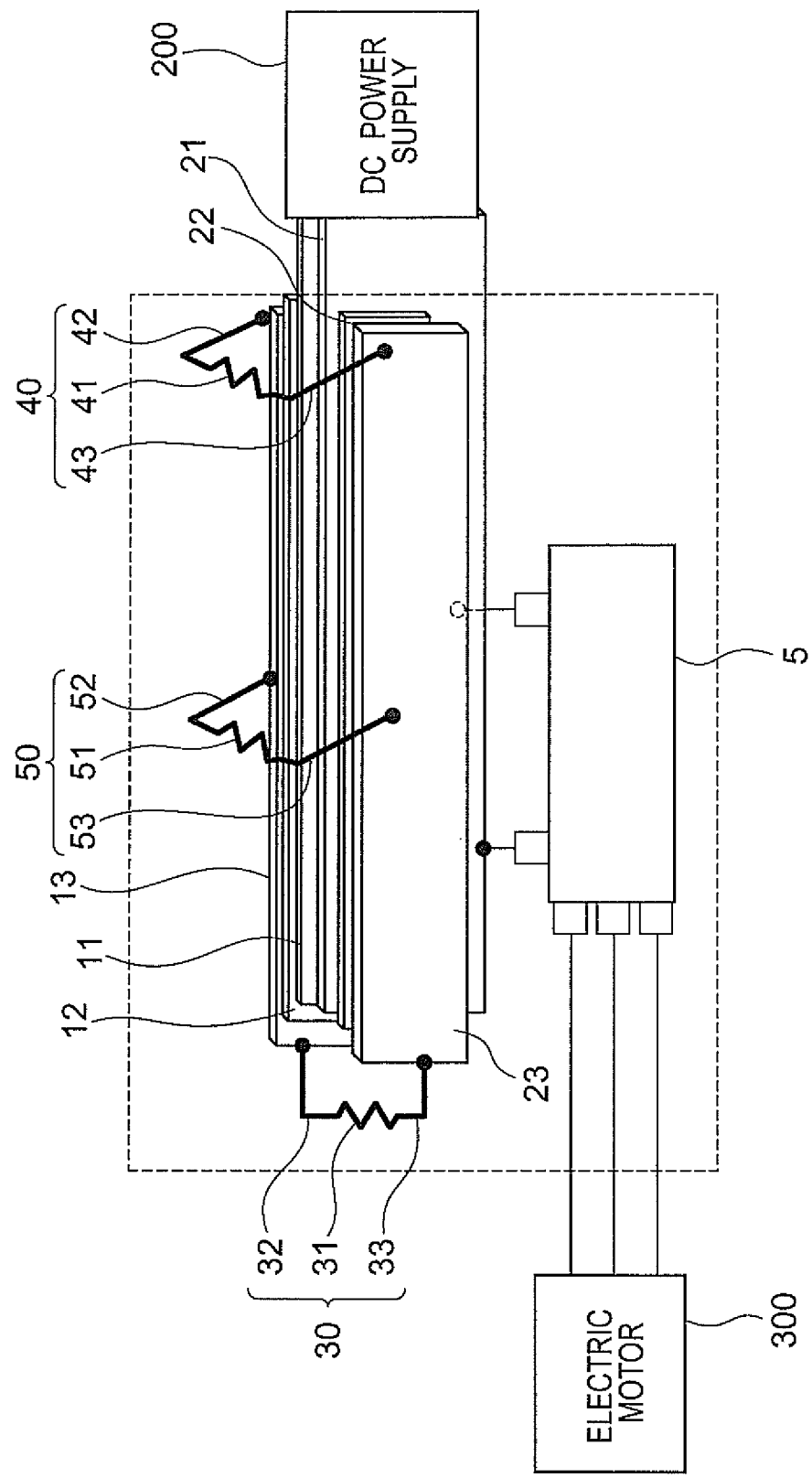
FIG. 20 is a schematic diagram of a drive system for an electric vehicle including a power conversion device according to a first modified example of the eighth embodiment of the present invention.

In this embodiment, a connection circuit 50 including a resistor 51 and lines 52 and 53 may further be connected between the conductive body 13 and the conductive body 23, as shown in FIG. 20. In addition, one or more resistors similar to the resistors 31, 41, and 51 may further be connected between the conductive body 13 and the conductive body 23. The connection circuit 50 is a circuit similar to the connection circuits 30 and 40.

Figure 21:
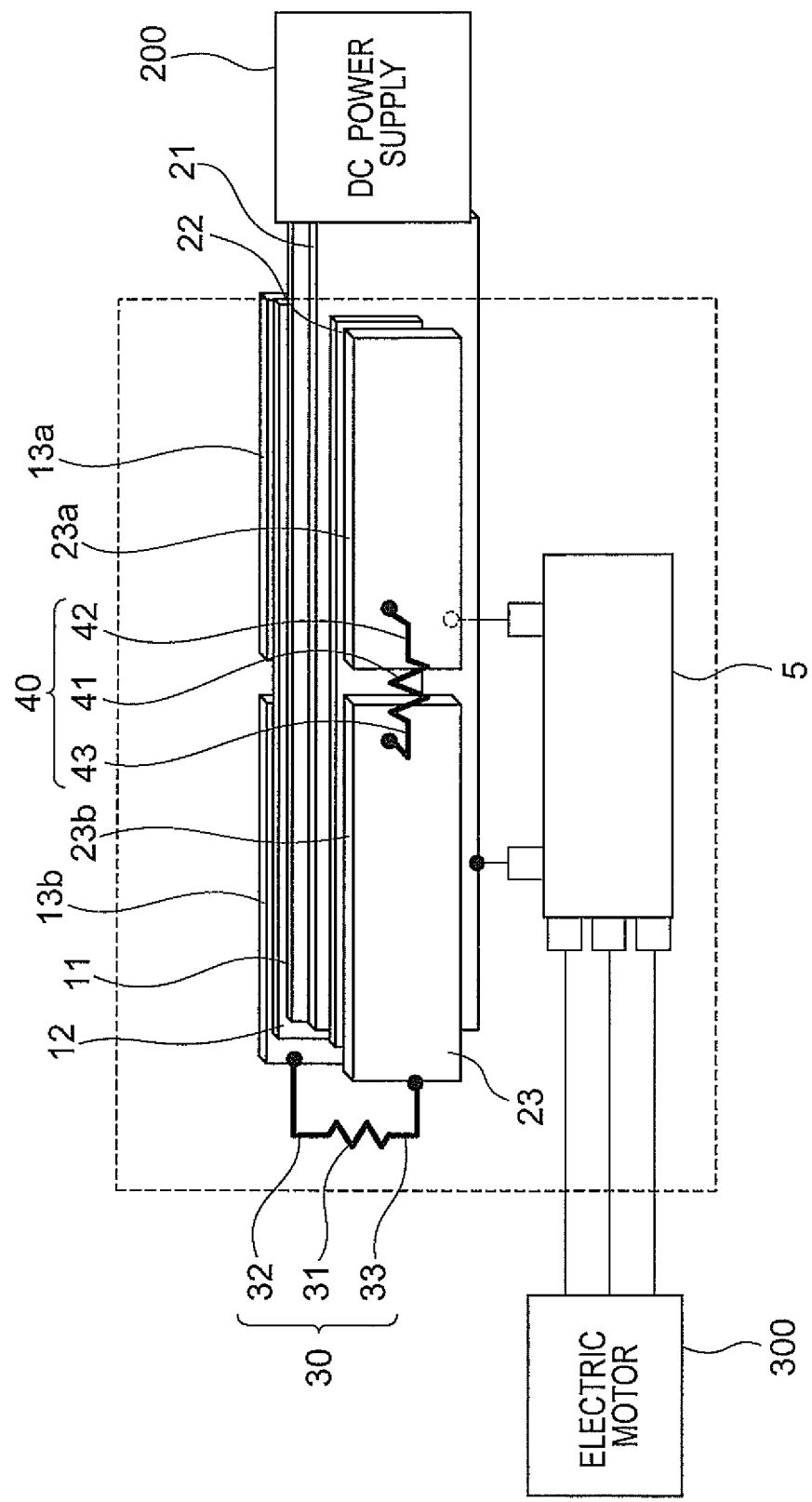
FIG. 21 is a schematic diagram of a drive system for an electric vehicle including a power conversion device according to a second modified example of the eighth embodiment of the present invention.

In this embodiment, as shown in FIG. 21, the conductive body 13 may be formed from a conductive body 13a and a conductive body 13b each having a flat plate shape, and the conductive body 23 may be formed from a conductive body 23a and a conductive body 23b each having a flat plate shape. Then, the conductive body 13a and the conductive body 13b may be connected to each other using a connection circuit 40 while the conductive body 23a and the conductive body 23b may be connected to each other using another connection circuit 40. Thereby, the noise current induced by the capacitors can be used by the multiple resistors for generating heat. Thus, it is possible to shorten the time needed for suppressing the noise. In addition, it is possible to disperse modes of the noise and thus to enhance the noise suppression effect.

Ninth Embodiment

Figure 22:
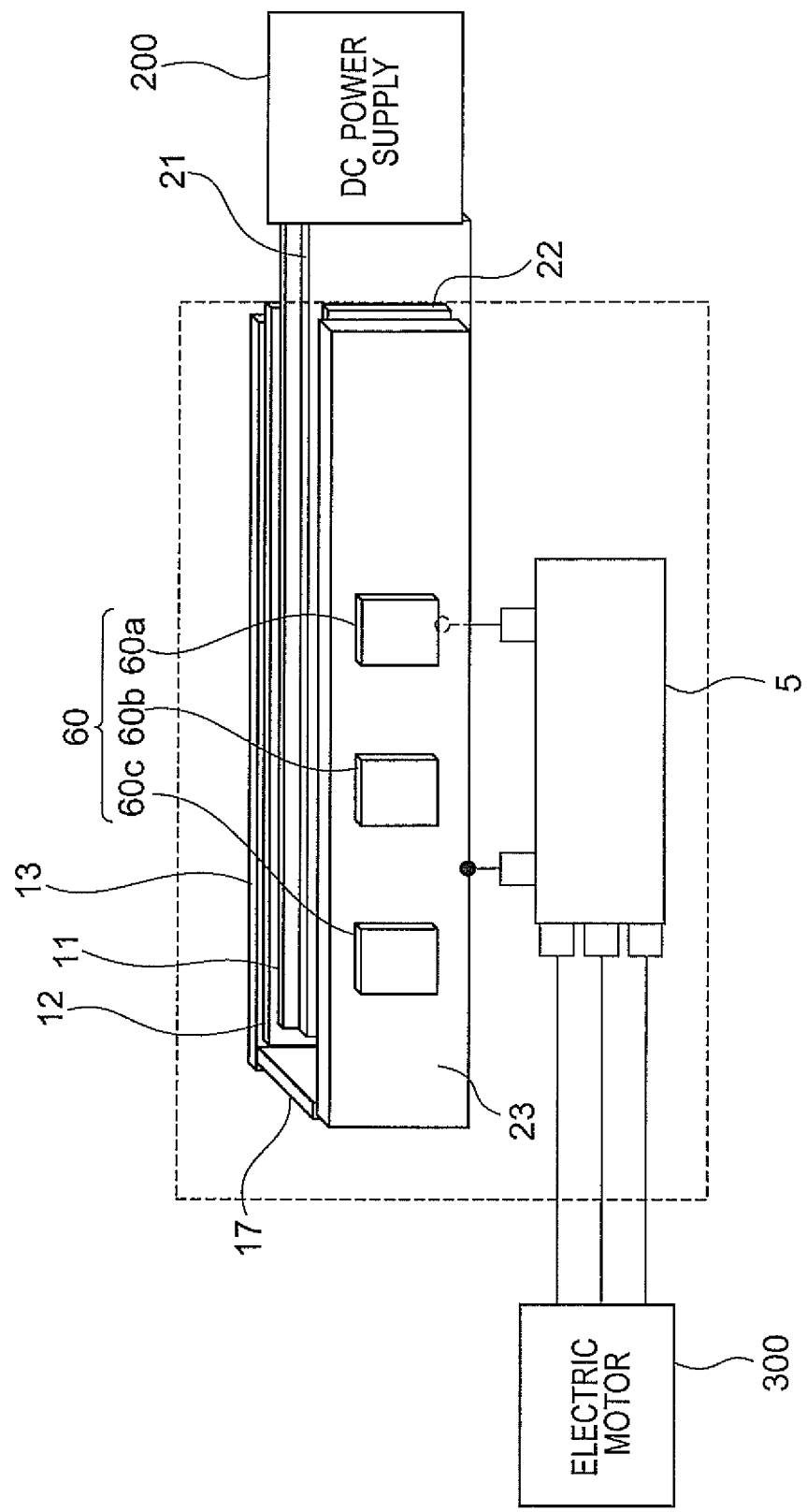
FIG. 22 is a schematic diagram of a drive system for an electric vehicle including a power conversion device according to another embodiment of the present invention.

A drive system for an electric vehicle including a power conversion device according to another embodiment of the present invention will be described with reference to FIG. 22. This embodiment is different from the above-described first embodiment in that resistors 60 are provided in this embodiment. Since the configurations other than the above are the same as those of the above-described first embodiment, the descriptions thereof will be incorporated herein as appropriate.

The resistors 60 include resistors 60a to 60c. Each of the resistors 60a to 60c is formed in a plate shape. Moreover, the resistors 60a to 60c are provided at given intervals on one of side surfaces of the conductive body 23, which is the side surface not opposed to the dielectric body 22. Here, the material of the resistors 60a to 60c is selected such that a resistance value per unit length of the resistors 60a to 60c becomes greater than a resistance value per unit length of the conductive body 23. Alternatively, the shapes of the resistors 60a to 60c are designed to meet the aforementioned requirement.

A plate-shaped conductive body 17 is connected between a tip end of the conductive body 13 and a tip end of the conductive body 23. The conductive body 13 and the conductive body 23 are electrically connected to each other through the conductive body 17.

The resistance value of the resistors 60a to 60c is higher than the resistance value of the conductive bodies 13, 17, and 23. The resistors 60a to 60c are provided in order to increase the resistance of the conductive body 23. When noise currents attributed to the noise generated in the power supply buses 11 and 21 flow on the conductive bodies 13, 17, and 23, the noise currents are used by the resistors 60a to 60c with the higher resistance value for generating heat. Thus, the resistors 60a to 60c absorb the noise current with a high frequency.

As described above, in this embodiment, the resistors 60 having the resistance value higher than the resistance value of the conductive body 13 or the conductive body 23 are provided to the conductive body 23, and the conductive body 17 electrically connects the conductive body 13 and the conductive body 23 together. Thereby, the noise currents attributed to the noise generated in the power supply buses 11 and 21 are used by the resistors 60. Thus, it is possible to suppress the noise generated in the power supply buses 11 and 21.

Figure 23:
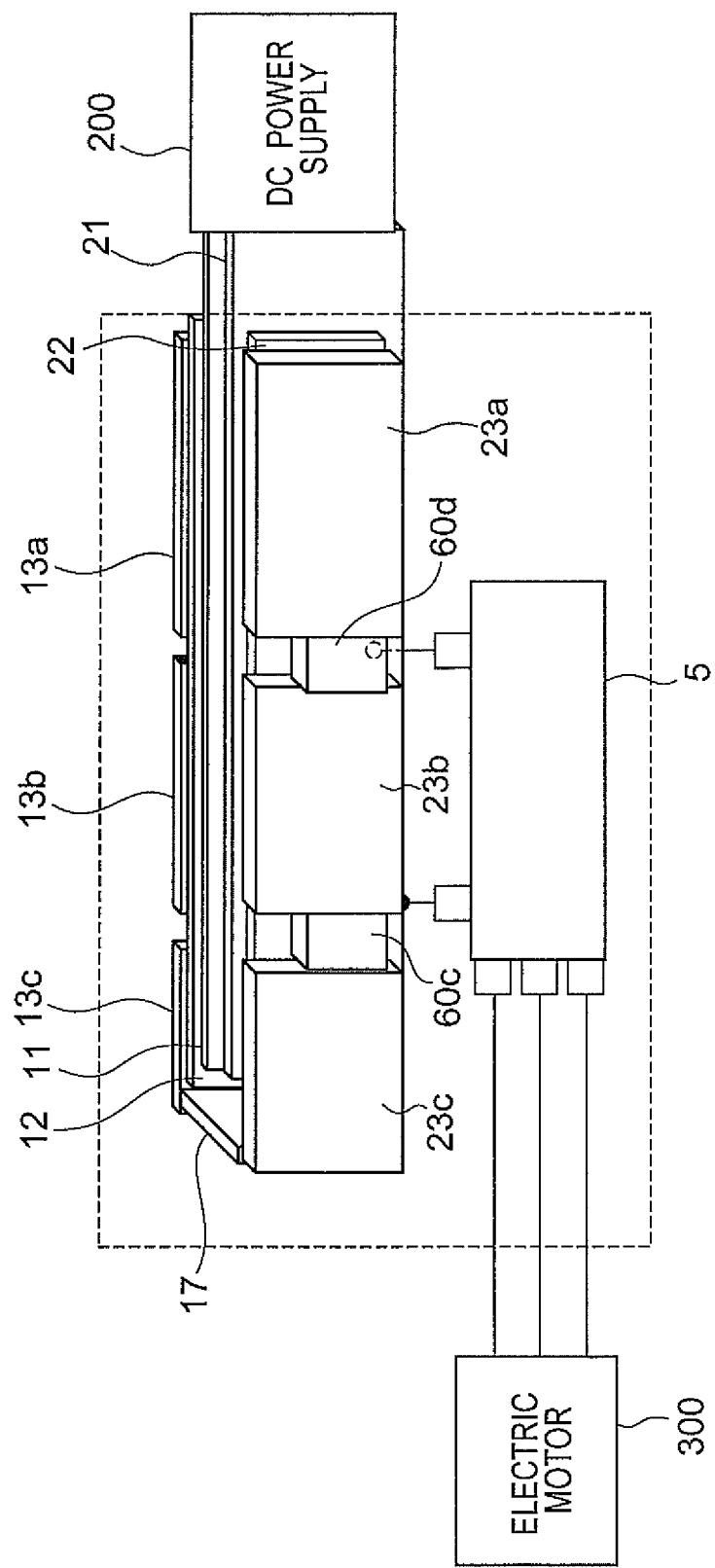
FIG. 23 is a schematic diagram of a drive system for an electric vehicle including a power conversion device according to a modified example of the ninth embodiment of the present invention.

In this embodiment, as shown in FIG. 23, the conductive body 13 may be formed from a conductive body 13a, a conductive body 13b, and a conductive body 13c each having a flat plate shape, and the conductive body 23 may be formed from a conductive body 23a, a conductive body 23b, and a conductive body 23c each having a flat plate shape. Then, resistors 60a to 60d may be provided at spaces between the conductive body 13a and the conductive body 13b, between the conductive body 13b and the conductive body 13c, between the conductive body 23a and the conductive body 23b, and between the conductive body 23b and the conductive body 23c. Note that the resistors 60a and 60b are hidden behind the conductive body 13 and the like, and are therefore not illustrated in FIG. 23.

Thus, when noise currents attributed to the switching noise are conducted between the conductive body 13a and the conductive body 13b, between the conductive body 13b and the conductive body 13c, between the conductive body 23a and the conductive body 23b, and between the conductive body 23b and the conductive body 23c, the noise currents flow on the added resistors 60a to 60d and are used by the resistors 60a to 60d for generating heat. For this reason, it is possible to suppress the noise generated in the power supply buses 11 and 21. In addition, each of the resistors 60a to 60d can be reduced in size in comparison with each of the resistors 60a to 60c shown in FIG. 22.

Although the resistance is increased by providing the resistors 60a to 60d in this embodiment, resistors 60a to 60d may be formed by providing ferrite to at least portions of the conductive bodies 13, 17, and 23, instead of the aforementioned resistors 60a to 60d. Thereby, a resistance value in each of the conductive bodies 13, 17 and 23 is higher at the ferrite-containing portion than at the other portion containing no ferrite. Accordingly, each ferrite-containing portion can use a noise current, thereby suppressing the noise. Here, it is only necessary to spray ferrite onto parts of the conductive body 23. Thus, the resistance components can easily be added to the conductive bodies 13, 17, and 23.

Here, the resistors 60 may be provided to the conductive body 17.

Note that the resistors 60a to 60d of this embodiment correspond to the "resistor" according to the present invention, and the conductive body 17 thereof corresponds to the "connection circuit" of the present invention.

Tenth Embodiment

Figure 24:
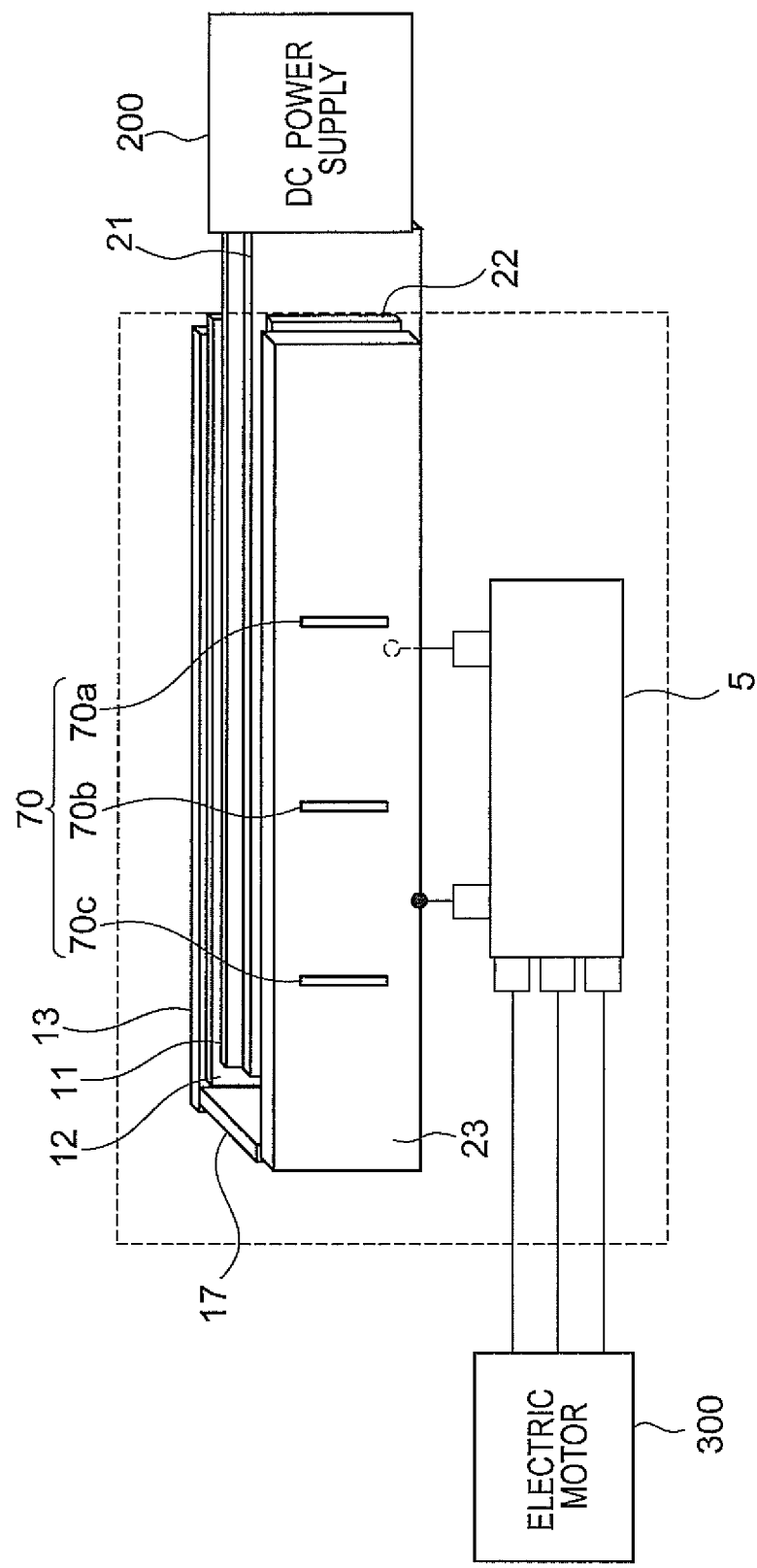
FIG. 24 is a schematic diagram of a drive system for an electric vehicle including a power conversion device according to the other embodiment of the present invention.

A drive system for an electric vehicle including a power conversion device according to another embodiment of the present invention will be described with reference to FIG. 24. This embodiment is different from the above-described ninth embodiment in that the conductive body 23 is provided with slits 70. Since the configurations other than the above are the same as those of the above-described ninth embodiment, the descriptions thereof will be incorporated herein as appropriate.

The slits 70 are provided on a side surface of the conductive body 23. The slits 70 include three slits 70a to 70c. The slits 70 are formed in such a manner as to penetrate from one side surface to the other side surface of the conductive body 23, which are opposite from each other. On a cross section of the conductive body 23 taken parallel to the slits 70, the cross-sectional area of a portion provided with a slit 70 is smaller than the cross-sectional area of a portion not provided with a slit 70. For this reason, a resistance value of the portion provided with the slit 70 becomes higher than a resistance value of the portion not provided with the slit 70. Accordingly, when the switching noise is generated by the switching operation of the power module 5 and the noise current flows on the conductive body 23, the noise current is used by the portions provided with the slits 70 for generating heat.

As described above, in this embodiment, the conductive body 23 is provided with the slits 70, each of which is formed to make the cross-sectional area of the corresponding portion smaller than the cross-sectional area of the remaining portions. Thus, each slit 70 forms the portion where the resistance is increased. In this way, the resistance of the conductive body 23 is increased at each of the portions provided with the slits 70. Thus, the noise currents generated in the power supply buses 11 and 21 can be used by these portions for generating heat, and the noise can be suppressed. In addition, the slits 70 can be formed by processing the corresponding parts of the conductive body 23. Thus, the resistance components can be easily added to the conductive body 23.

Although the three slits 70 are provided in this embodiment, two slits may be instead provided therein, or four or more slits 70 may be provided therein. Here, the slits 70 may be provided to the conductive body 13 or the conductive body 17.

The entire contents of Japanese Patent Application No. 2011-186995 (filing date: Aug. 30, 2011) are incorporated herein.

Although the contents of the present invention have been described with reference to the embodiments, it is obvious to those skilled in the art that the present invention is not limited only to these descriptions but various modifications and improvements are possible.

According to the present invention, noise generated in a power supply bus due to the switching of an inverter is absorbed by a resistor included in a connection circuit, and the noise can thus be suppressed. The present invention is therefore industrially applicable.

The invention claimed is:

1. A power conversion device comprising:
an inverter configured to change electric power outputted from a power supply;
a first power supply bus connected to the inverter and a positive electrode of the power supply;
a second power supply bus connected to the inverter and a negative electrode of the power supply;
a first conductive body forming a capacitor in conjunction with the first power supply bus;
a second conductive body forming a capacitor in conjunction with the second power supply bus; and
a connection circuit including a resistor and configured to electrically connect the first conductive body and the second conductive body together, wherein a resistance value of the resistor is higher than a resistance value of the first conductive body and the second conductive body.

2. The power conversion device according to claim 1, further comprising:
a first dielectric body provided between the first power supply bus and the first conductive body; and
a second dielectric body provided between the second power supply bus and the second conductive body.

3. The power conversion device according to claim 1, further comprising:
a first dielectric body provided between the first power supply bus and the first conductive body while covering at least part of a surface of the first power supply bus, and made of a resin; and
a second dielectric body provided between the second power supply bus and the second conductive body while covering at least part of a surface of the second power supply bus, and made of a resin.

4. The power conversion device according to claim 1, wherein a resistance value of the resistor is set at a value being proportional to a square root of an inductance component between the first power supply bus and the second power supply bus, and being inversely proportional to a square root of a capacitance component between the first power supply bus and the second power supply bus.

5. The power conversion device according to claim 1, wherein a resistance value of the resistor is set at a value being proportional to a square root of a distance between the first power supply bus and the second power supply bus, and being inversely proportional to a square root of the area of any of an opposed surface of the first power supply bus facing the second power supply bus and an opposed surface of the second power supply bus facing the first power supply bus.

6. The power conversion device according to claim 1, wherein
the resistor is connected to any of the first conductive body and the second conductive body.

7. The power conversion device according to claim 1, wherein the resistor is formed from a slit made in one of the first conductive body and the second conductive body, the slit rendering the cross-sectional area of a portion of the one of the first conductive body and the second conductive body smaller than the cross-sectional area of another portion of the one of the first conductive body and the second conductive body.

8. The power conversion device according to claim 1, wherein the resistor is made from ferrite contained in any of the first conductive body and the second conductive body.

9. The power conversion device according to claim 1, wherein any of the first conductive body and the second conductive body is made from a metal tape.

10. The power conversion device according to claim 1, wherein
a resistance value of the resistor is set in accordance with a frequency of noise generated in any of the power supply buses by a switching operation of the inverter.

11. The power conversion device according to claim 2, wherein
the first power supply bus is located at the center of an axis,
the first dielectric body covers an outer periphery of the first power supply bus,
the first conductive body covers an outer periphery of the first dielectric body,
the power conversion device further comprises a first insulating portion covering an outer periphery of the first conductive body,
the first power supply bus, the first dielectric body, the first conductive body, and the first insulating portion are concentrically arranged,
the second power supply bus is located at the center of an axis,
the second dielectric body covers an outer periphery of the second power supply bus,
the second conductive body covers an outer periphery of the second dielectric body,
the power conversion device further comprises a second insulating portion covering an outer periphery of the second conductive body, and
the second power supply bus, the second dielectric body, the second conductive body, and the second insulating portion are concentrically arranged.

12. The power conversion device according to claim 1, wherein
each of the first and second power supply buses has a cylindrical shape,
each of the first and second conductive bodies has a columnar shape made by bending a flat plate, and is disposed in such a manner as to cover part of a side surface of the corresponding one of the first and second power supply buses.

13. The power conversion device according to claim 1, further comprising a second connection circuit including a resistor and configured to electrically connect the first conductive body and the second conductive body together.

14. The power conversion device according to claim 1, wherein
the first conductive body is formed from two conductive bodies each having a flat plate shape, and
the power conversion device further comprises a second connection circuit including a resistor and configured to electrically connect the two conductive bodies together.

15. A power conversion device comprising:
an inverter configured to change electric power outputted from a power supply;
a first power supply bus connected to the inverter and a positive electrode of the power supply;
a second power supply bus connected to the inverter and a negative electrode of the power supply;
a first conductive body forming a capacitor in conjunction with the first power supply bus;
a second conductive body forming a capacitor in conjunction with the second power supply bus; and
a connection circuit including a resistor and configured to electrically connect the first conductive body and the second conductive body together, wherein the resistor is formed from a slit made in one of the first conductive body and the second conductive body, the slit rendering the cross-sectional area of a portion of the one of the first conductive body and the second conductive body smaller than the cross-sectional area of another portion of the one of the first conductive body and the second conductive body.

16. A power conversion device comprising:
an inverter configured to change electric power outputted from a power supply;
a first power supply bus connected to the inverter and a positive electrode of the power supply;
a second power supply bus connected to the inverter and a negative electrode of the power supply;
a first conductive body forming a capacitor in conjunction with the first power supply bus;
a second conductive body forming a capacitor in conjunction with the second power supply bus; and
a connection circuit including a resistor and configured to electrically connect the first conductive body and the second conductive body together, wherein the first conductive body is formed from two conductive bodies each having a flat plate shape, and the power conversion device further comprises a second connection circuit including a resistor and configured to electrically connect the two conductive bodies together.

* * * * *